(12) United States Patent
Huang et al.

(10) Patent No.: US 12,068,382 B2
(45) Date of Patent: Aug. 20, 2024

(54) DUMBBELL SHAPED SELF-ALIGNED CAPPING LAYER OVER SOURCE/DRAIN CONTACTS AND METHOD THEREOF

(71) Applicant: Taiwan Semiconductor Manufacturing Co., Ltd., Hsinchu (TW)

(72) Inventors: Lin-Yu Huang, Hsinchu (TW); Li-Zhen Yu, Hsinchu (TW); Chia-Hao Chang, Hsinchu (TW); Cheng-Chi Chuang, New Taipei (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 73 days.

(21) Appl. No.: 17/728,679

(22) Filed: Apr. 25, 2022

(65) Prior Publication Data
US 2022/0246740 A1    Aug. 4, 2022

Related U.S. Application Data

(62) Division of application No. 16/901,572, filed on Jun. 15, 2020, now Pat. No. 11,316,023.

(51) Int. Cl.
*H01L 29/417*   (2006.01)
*H01L 21/768*   (2006.01)
(Continued)

(52) U.S. Cl.
CPC .. *H01L 29/41791* (2013.01); *H01L 21/76877* (2013.01); *H01L 23/5226* (2013.01); *H01L 29/0847* (2013.01); *H01L 29/785* (2013.01)

(58) Field of Classification Search
CPC ......... H01L 29/41791; H01L 21/76877; H01L 23/5226; H01L 29/0847; H01L 29/785; H01L 21/76883; H01L 2221/1063; H01L 21/76831; H01L 21/76834; H01L 21/76897; H01L 21/823431; H01L 21/823475; H01L 21/823821; H01L 21/823871; H01L 27/0886; H01L 27/0924
See application file for complete search history.

(56) References Cited

U.S. PATENT DOCUMENTS 8,772,109 B2   7/2014   Colinge
8,785,285 B2   7/2014   Tsai et al.
(Continued)

*Primary Examiner* — Farun Lu
(74) *Attorney, Agent, or Firm* — Haynes and Boone, LLP

(57) ABSTRACT

A semiconductor structure includes a substrate; a first structure over the substrate and having a first gate stack and two first gate spacers on two opposing sidewalls of the first gate stack; a second structure over the substrate and having a second gate stack and two second gate spacers on two opposing sidewalls of the second gate stack; a source/drain (S/D) feature over the substrate and adjacent to the first and the second gate stacks; an S/D contact over the S/D feature and between one of the first gate spacers and one of the second gate spacers; a conductive via disposed over and electrically connected to the S/D contact; and a dielectric liner layer. A first portion of the dielectric liner layer is disposed on a sidewall of the one of the first gate spacers and is directly above the S/D contact and spaced from the S/D contact.

20 Claims, 24 Drawing Sheets

(51) Int. Cl.
*H01L 23/522* (2006.01)
*H01L 29/08* (2006.01)
*H01L 29/78* (2006.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,243,053 B1 * | 3/2019 | Xie ................. H01L 21/823437 |
| 2019/0393321 A1 * | 12/2019 | Xu ........................ H01L 29/518 |

* cited by examiner

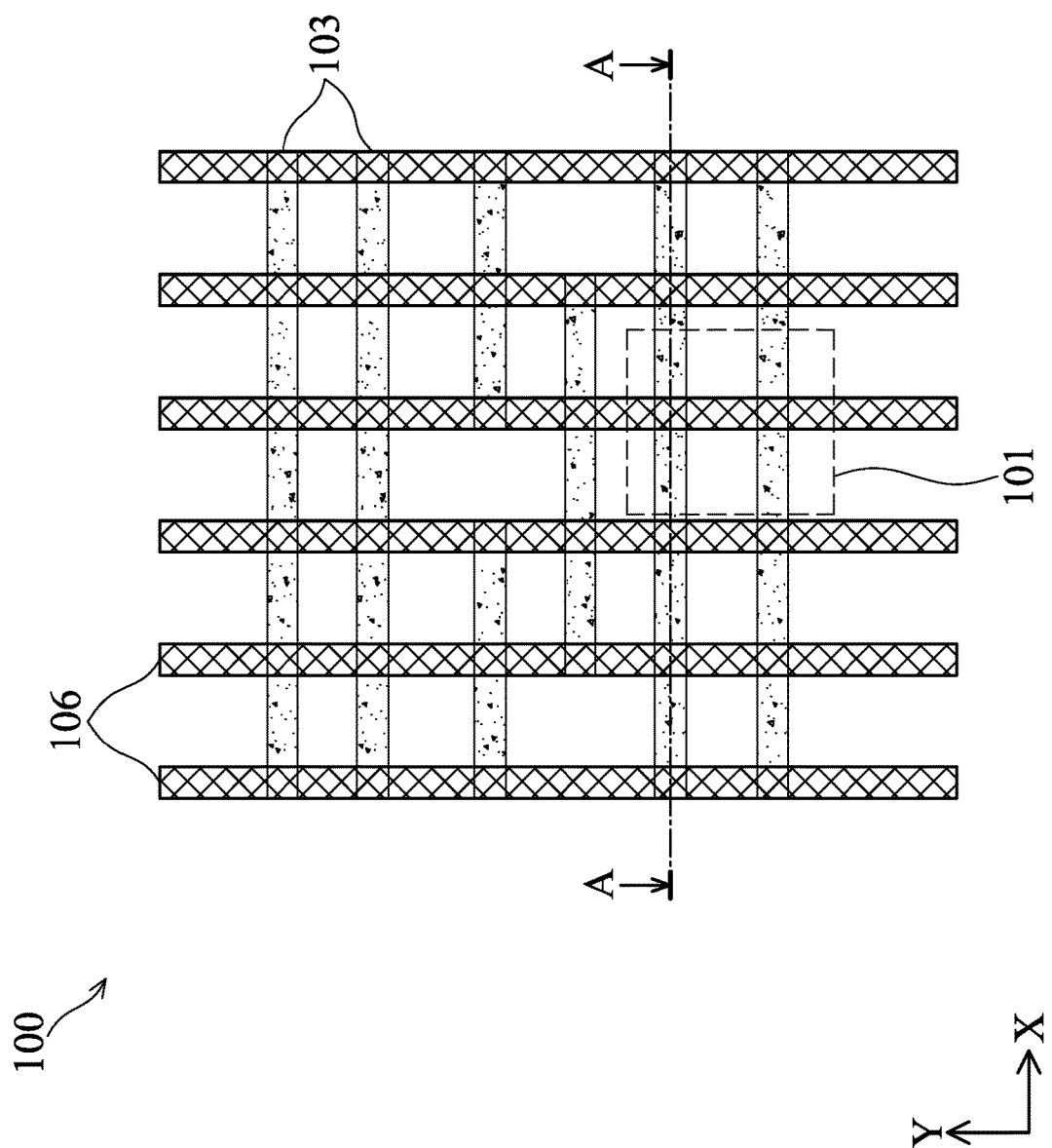

DUMBBELL SHAPED SELF-ALIGNED CAPPING LAYER OVER SOURCE/DRAIN CONTACTS AND METHOD THEREOF

PRIORITY

This is a divisional of U.S. patent application Ser. No. 16/901,572, filed Jun. 15, 2020, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. Hence, semiconductor manufacturing processes need continued improvements.

One area of improvements is in fabricating vias to source/drain (S/D) contacts. In some approaches, a liner layer is disposed over S/D contacts for providing etch selectivity during via hole etching. This liner layer is broken through before via metals are filled into the via holes. However, breaking through the liner layer often causes loss of thickness in nearby gate spacers or other dielectric layer, leading to a shortened distance between metal gates and S/D contact vias. Consequently, risks of short circuit due to metal leakage are increased. Accordingly, improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A illustrates a top view of a portion of a semiconductor device in an intermediate step of fabrication according to an embodiment of the method of FIGS. 1A-1C.

DETAILED DESCRIPTION

Figure 1A:
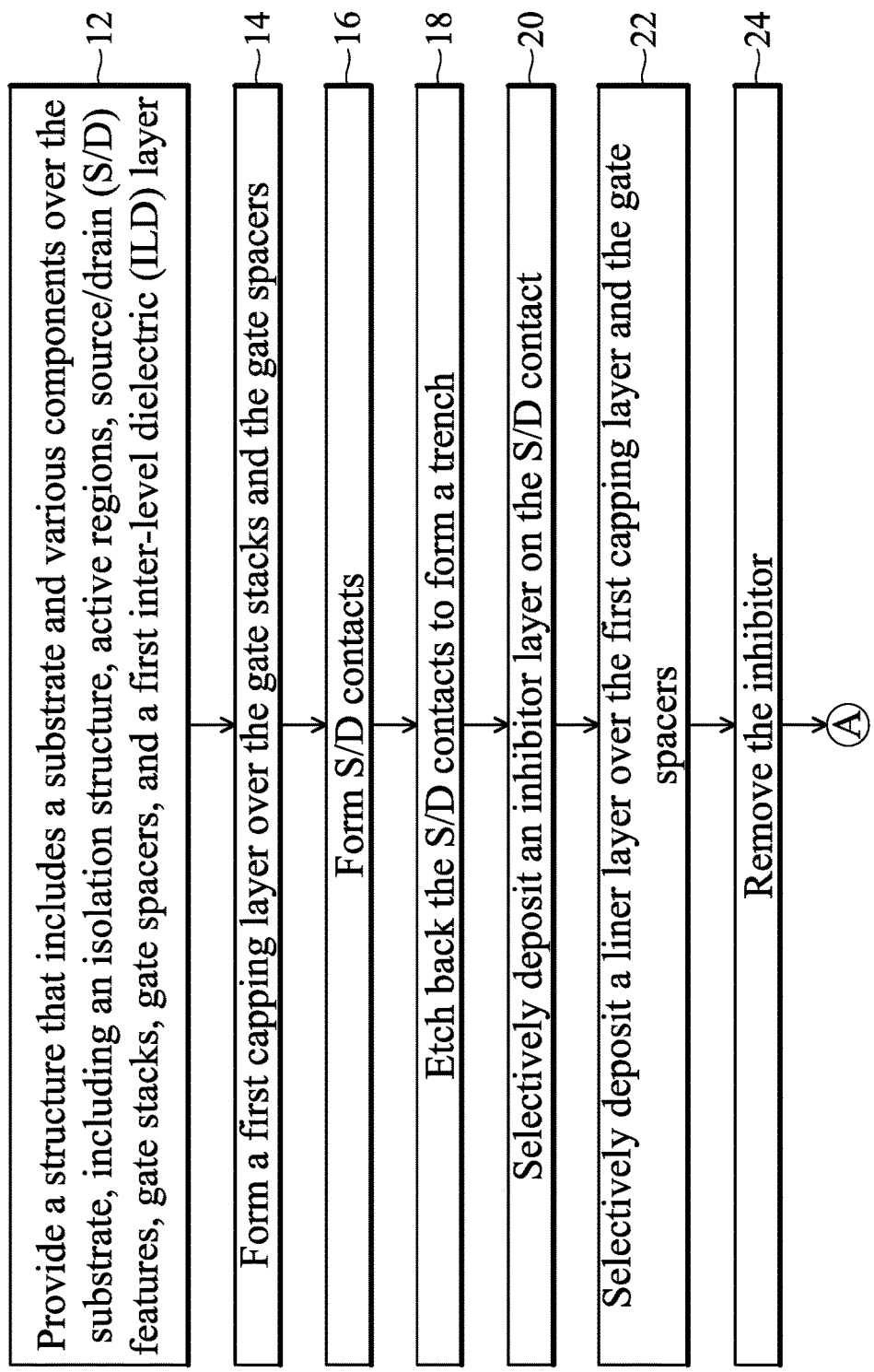
FIGS. 1A, 1B, and 1C show flow charts of a method of forming a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure relates to a semiconductor fabrication process and the structure thereof, and more particularly to forming vias on S/D contacts (so-called S/D contact via, i.e., a conductive via disposed on and electrically connected to a S/D contact) without having to break through a liner layer above the S/D contact. An object of the present disclosure is to enlarge the contact area between an S/D contact via and the underlying S/D contact while keeping good isolation between the S/D contact via and nearby gates. Another object of the present disclosure is to improve process robustness. To achieve these objects, a process according to the present disclosure includes depositing an inhibitor layer selectively on an S/D contact after opening a trench for self-aligned capping (SAC) layer. The inhibitor layer prevents the deposition of a dielectric material thereon. Subsequently, the process forms a liner layer (or a dielectric liner layer) on sidewalls of the SAC trench. Due to the property of the inhibitor layer, the liner layer is free from the bottom of the SAC trench. Subsequently, the inhibitor layer is removed and dielectric material(s) is deposited into the SAC trench to form a dumbbell-shaped SAC layer. Notably, the liner layer is disposed on the sidewalls of the SAC layer but not at the bottom of the SAC layer. Thus, a vertical etching of the liner layer is avoided when etching via holes through the SAC layer, which generally improves the process's robustness and the device's TDDB (Time Dependent Dielectric Breakdown) performance. These and other aspects of the present disclosure are further described by referring to the accompanied figures.

Figure 1B:
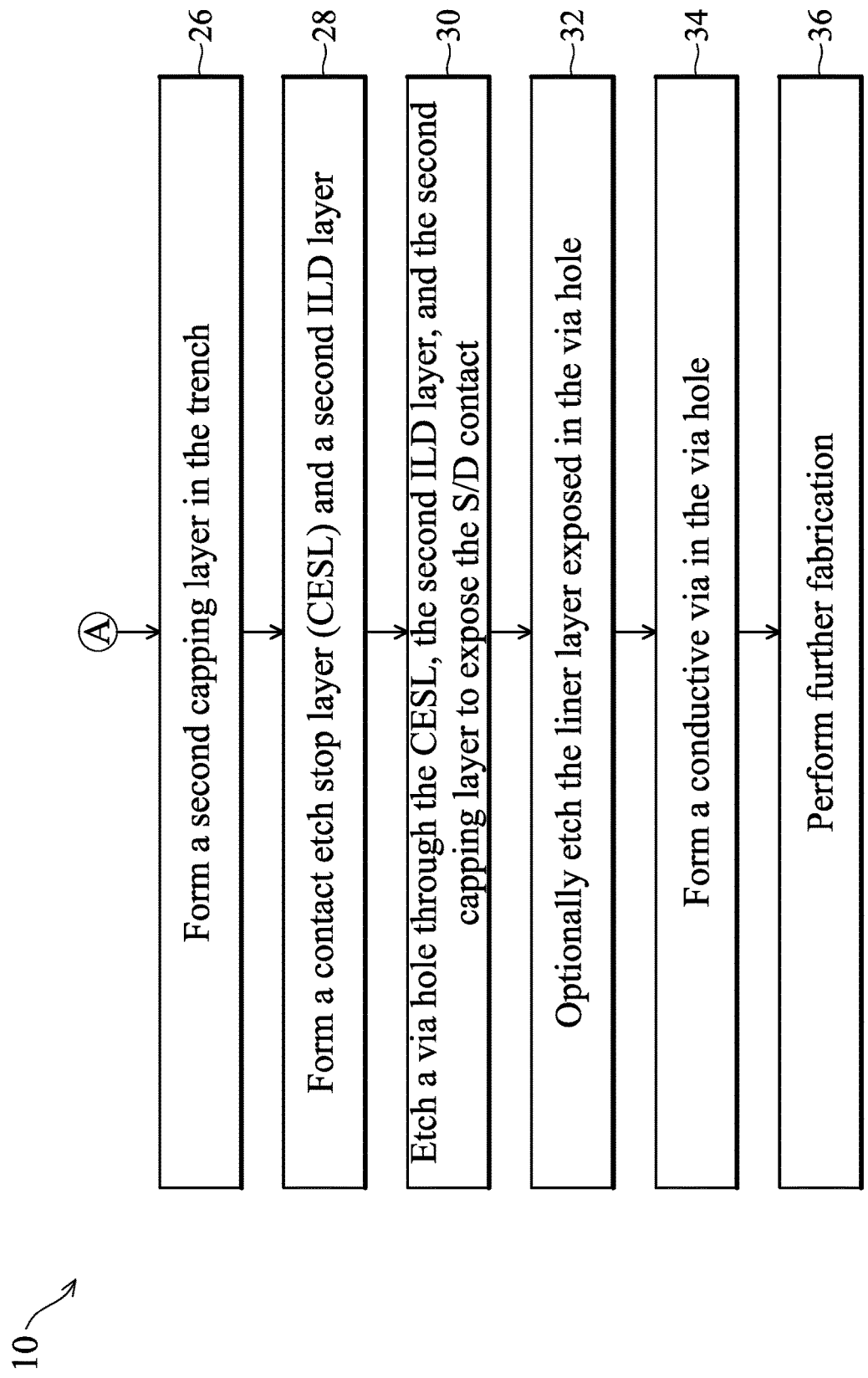
Figure 1C:
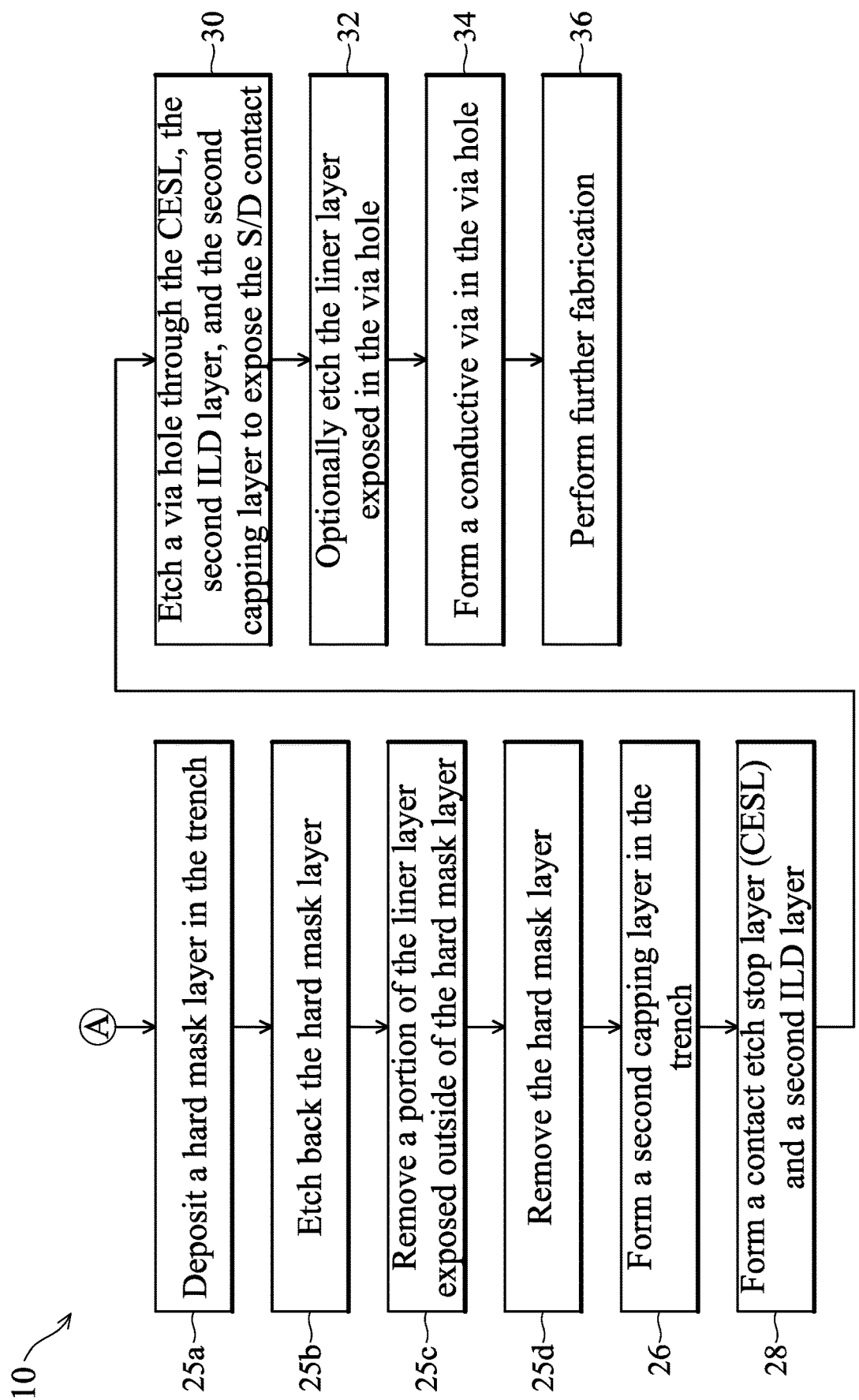

FIGS. 1A and 1B are a flow chart of an embodiment of a method 10 for fabricating a semiconductor device according to various aspects of the present disclosure. FIGS. 1A and 1C are a flow chart of an alternative embodiment of the method 10 according to various aspects of the present disclosure. Additional processing is contemplated by the present disclosure. Additional operations can be provided before, during, and after method 10, and some of the operations described can be moved, replaced, or eliminated for additional embodiments of method 10.

Method 10 is described below in conjunction with FIGS. 2A-34 that illustrate various top, perspective, and cross-sectional views of a semiconductor device 100 at various steps of fabrication according to the method 10, in accordance with some embodiments. In some embodiments, the device 100 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the device 100 is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof. FIGS. 2A-21 have been simplified for the sake of clarity to better understand the inventive concepts of the present disclosure. Additional features can be added in the device 100, and some of the features described below can be replaced, modified, or eliminated in other embodiments of the device 100.

Figure 2B:
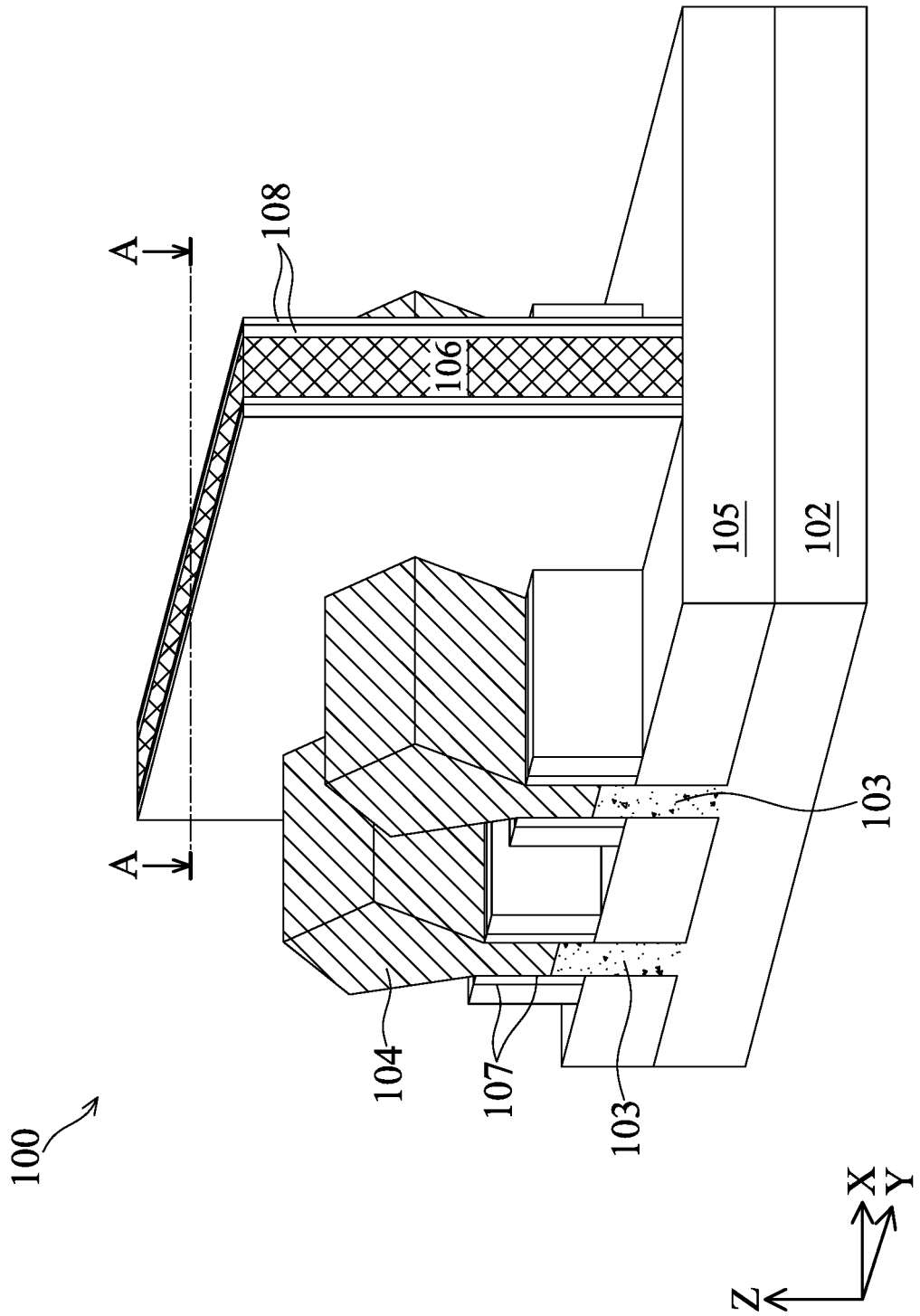
FIG. 2B illustrates a perspective view of a portion 101 of the semiconductor device in FIG. 2A according to an embodiment.
Figure 3:
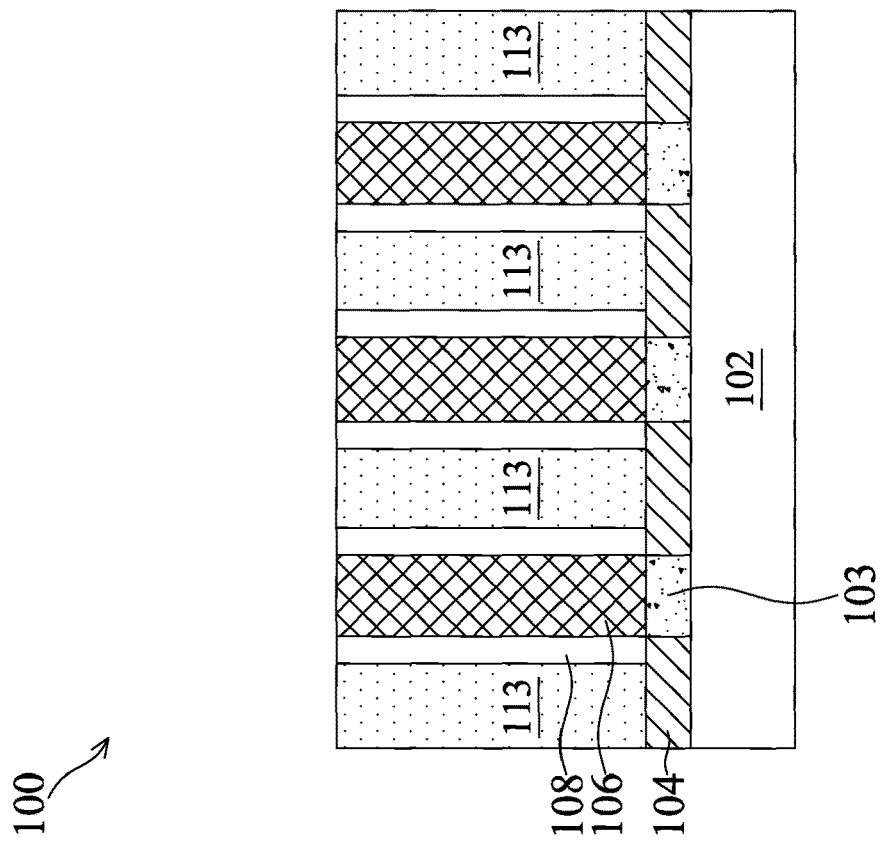

At operation 12, the method 10 (FIG. 1A) provides a workpiece (or a structure) of the device 100, an embodiment of which is illustrated in FIGS. 2A, 2B, and 3. Particularly, FIGS. 2A and 2B illustrate a top view and a perspective view, respectively, of a portion of the device 100 according to an embodiment and FIG. 3 illustrates a cross-sectional view of a portion of the device 100 along the A-A line in FIGS. 2A and 2B, according to an embodiment.

Referring to FIG. 2A, the device 100 includes active regions 103 oriented lengthwise along an "x" direction and gate stacks (or gate structures) 106 oriented lengthwise along a "y" direction that is generally perpendicular to the "x" direction. In the present embodiment, the active regions 103 are semiconductor fins. Hereinafter the active regions 103 are also referred to as semiconductor fins 103 or fins 103. The active regions 103 may be of other shapes or configurations in other embodiments. For example, the active regions 103 may include a stack of semiconductor layers for nanosheet or nanowire devices.

Referring to FIGS. 2A, 2B, and 3 collectively, the device 100 includes a substrate 102, over which the fins 103 and the gate stacks 106 are formed. The device 100 includes an isolation structure 105 for isolating the fins 103. The fins 103 extend from the substrate 102 and above the isolation structure 105. The gate stacks 106 are disposed above the isolation structure 105 and on three sides of every fin 103. The device 100 further includes gate spacers 108 on sidewalls of the gate stacks 106 and optional fin sidewall spacers 107 on some sidewalls of the fins 103. The device 100 further includes S/D features 104 on top of the fins 103 and on both sides of the gate stacks 106, and one or more dielectric layers 113 over the S/D features 104 and over the spacers 107 and 108. The various features (or components) of the device 100 are further described below.

The substrate 102 is a silicon (Si) substrate in the present embodiment, such as a silicon wafer. In alternative embodiments, the substrate 102 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium (SiGe), silicon germanium carbide (SiGeC), gallium arsenic phosphide (GaAsP), and gallium indium phosphide (GaInP). In embodiments, the substrate 102 may include silicon on insulator (SOI) substrate, be strained and/or stressed for performance enhancement, include epitaxial regions, doped regions, and/or include other suitable features and layers.

The fins 103 may include one or more layers of semiconductor materials such as silicon or silicon germanium. The fins 103 may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into semiconductor layers over or in the substrate 102, leaving the fins 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasma, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 103 may be suitable. In some embodiments where the device 100 includes gate-all-around transistors such as nanosheet devices or nanowire devices, the fins 103 include multiple layers of semiconductor materials (such as silicon) that are vertically stacked (along the "z" direction) and portions of the gate stacks 106 wrap around each of the multiple layers of semiconductor materials in the channel regions of the transistors.

The S/D features 104 include epitaxially grown semiconductor materials such as epitaxially grown silicon, germanium, or silicon germanium. The S/D features 104 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D features 104 may be doped with n-type dopants and/or p-type dopants. In some embodiments, for n-type transistors, the S/D features 104 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the S/D features 104 include silicon germanium or germanium, and can be doped with boron, other p-type dopant, or combinations thereof (for example, forming Si:Ge:B epitaxial S/D features). The S/D features 104 may include multiple epitaxial semiconductor layers having different levels of dopant density. The S/D features 104 may include lightly doped S/D features, heavily doped S/D features, or other types of S/D features. In some embodiments, annealing processes (e.g., rapid thermal annealing (RTA) and/or laser annealing) are performed to activate dopants in the S/D features 104.

The isolation structure 105 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 105 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 105. Other types of isolation structure may also be suitable, such as field oxide and LOCal Oxidation of Silicon (LOCOS). The isolation structure 105 may include a multi-layer structure, for example, having one or more liner layers (e.g., silicon nitride) on surfaces of the substrate 102 and the fins 103 and a main isolating layer (e.g., silicon dioxide) over the one or more liner layers.

In an embodiment, each gate stack 106 includes a gate dielectric layer over the fins 103 and a gate electrode layer over the gate dielectric layer. The gate dielectric layer may include a high-k dielectric material such as hafnium oxide, zirconium oxide, lanthanum oxide, titanium oxide, yttrium oxide, and strontium titanate. The gate dielectric layer may be formed by chemical oxidation, thermal oxidation, atomic layer deposition (ALD), chemical vapor deposition (CVD), and/or other suitable methods. In some embodiments, the gate stack 106 further includes an interfacial layer between the gate dielectric layer and the fin 103. The interfacial layer may include silicon dioxide, silicon oxynitride, or other suitable materials. In some embodiments, the gate electrode layer includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer may be formed by CVD, PVD, plating, and/or other suitable processes.

Each of the fin sidewall spacers 107 and the gate spacers 108 may be a single layer or multi-layer structure. In some embodiments, each of the spacers 107 and 108 include a dielectric material, such as silicon oxide ($SiO_2$), silicon nitride ($Si_3N_4$), silicon oxynitride (SiON), other dielectric material, or combination thereof. In an example, the spacers 107 and 108 are formed by depositing a first dielectric layer (e.g., a $SiO_2$ layer having a substantially uniform thickness) as an liner layer over the device 100 including the gate stacks 106 and the fins 103, and a second dielectric layer (e.g., a $Si_3N_4$ layer) as a main D-shaped spacer over the first dielectric layer, and then, anisotropically etching to remove portions of the dielectric layers to form the spacers 107 and 108. Additionally, the fin sidewall spacers 107 may be partially removed during the etching process that forms recesses into the fins 103 prior to growing the S/D features 104. In some embodiments, the fin sidewall spacers 107 may be completely removed by such etching process.

The one or more dielectric layers 113 may include a contact etch stop layer (CESL) and an inter-layer dielectric (ILD) layer over the CESL. The CESL may comprise silicon nitride, silicon oxynitride, silicon nitride with oxygen (O) or carbon (C) elements, and/or other materials; and may be formed by CVD, PVD, ALD, or other suitable methods. The ILD layer may comprise tetraethylorthosilicate (TEOS) oxide, un-doped silicate glass, or doped silicon oxide such as borophosphosilicate glass (BPSG), fluoride-doped silicate glass (FSG), phosphosilicate glass (PSG), boron doped silicate glass (BSG), and/or other suitable dielectric materials; and may be formed by PECVD (plasma enhanced CVD), FCVD (flowable CVD), or other suitable methods.

At operation 14, the method 10 (FIG. 1A) forms a capping layer 109 over the gate stacks 106 and the gate spacers 108. This involves a variety of processes, an embodiment of which is shown in FIGS. 4-6.

Figure 4:
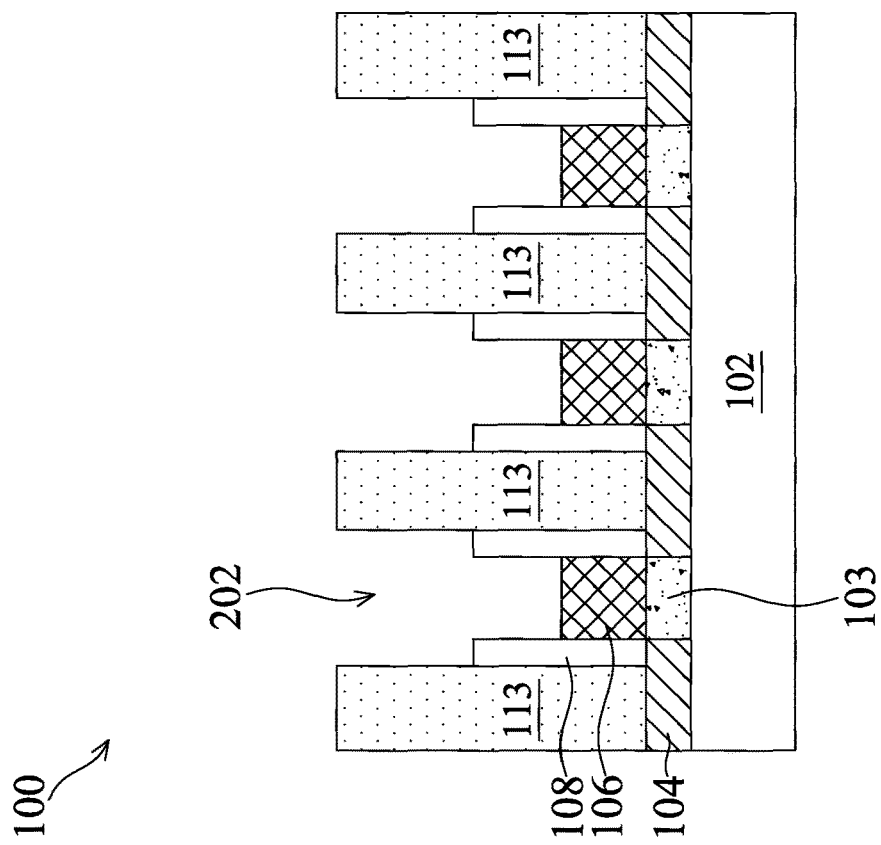
FIGS. 3, 4, 5, 6, 7, 8, 9, 10, 11, 12, 13, 14, 15, 16, and 17 illustrate cross-sectional views of a portion of a semiconductor device along the A-A line in FIGS. 2A and 2B, according to some embodiments, in intermediate step of fabrication according to an embodiment of the method of FIGS. 1A-1B.

Referring to FIG. 4, trenches 202 are formed in the device 100 by recessing the gate stacks 106 and optionally the gate spacers 108. In an embodiment, the gate stacks 106 and the gate spacers 108 are recessed by one or more etching processes that are tuned to etch the gate stacks 106 and the gate spacers 108 with no (or minimal) etching to the dielectric layer(s) 113. This is referred to as a self-aligned etching process. The one or more etching processes may include dry etching, wet etching, reactive ion etching, or other suitable etching. Further, at least one of the etching processes is further tuned to etch the gate stacks 106 at a faster rate than etching the gate spacers 108. Accordingly, the top surface of the gate stacks 106 are recessed to a level below the top surfaces of the gate spacers 108. This results in T-shaped trenches 202 in the present embodiment. In some embodiments, the trenches 202 may assume other shapes such as a rectangular shape where top surfaces of the gate stacks 106 and the gate spacers 108 are about even or where the gate spacers 108 are not recessed and only the gate stacks 106 are recessed.

Figure 5:
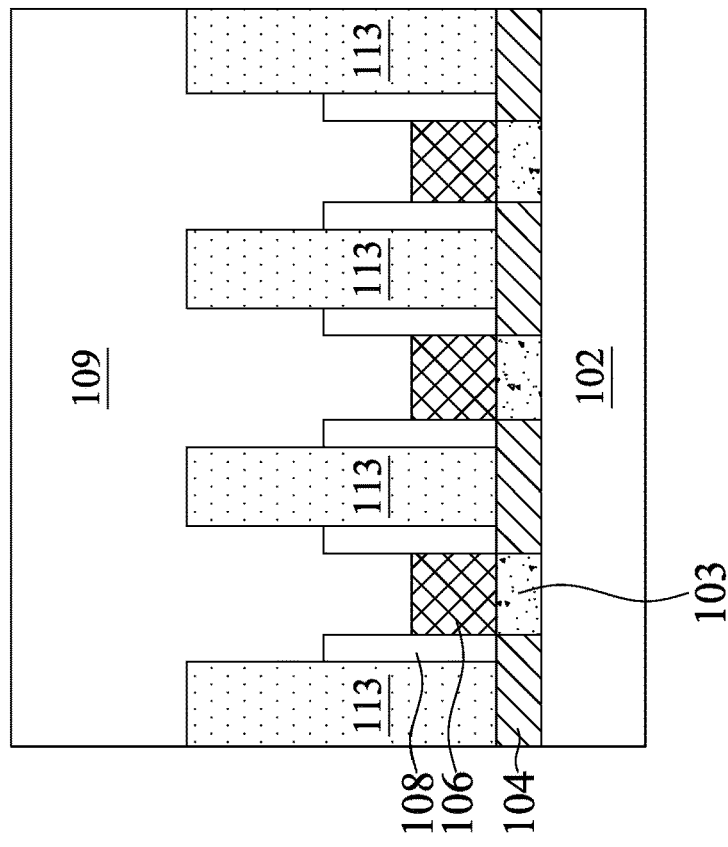

Referring to FIG. 5, one or more dielectric materials 109 are deposited over the device 100 and fill in the trenches 202. The one or more dielectric materials 109 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by atomic layer deposition (ALD), CVD, and/or other suitable methods.

Figure 6:
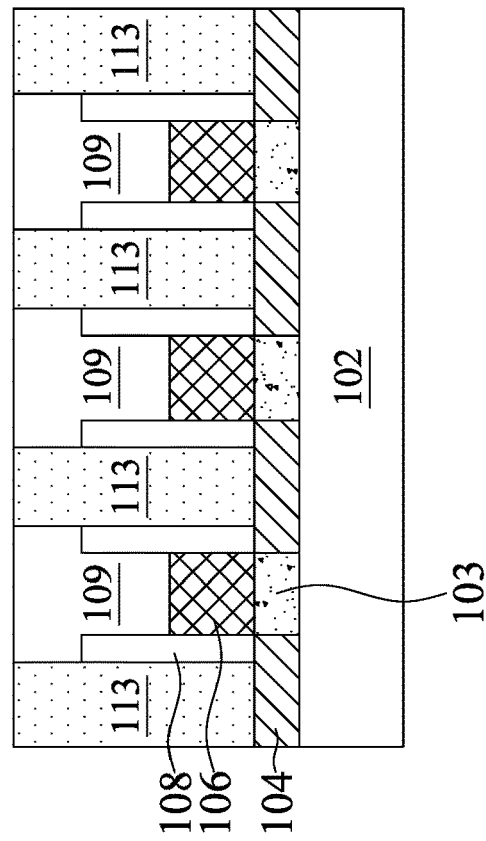

Referring to FIG. 6, a chemical mechanical planarization (CMP) process is performed to the one or more dielectric materials 109 and removes them from the top of the dielectric layer 113, leaving remaining portions of the one or more dielectric materials 109 in the trenches 202 as the capping layer 109. The dielectric layer 113 may be partially removed by the CMP process as well. Since the capping layer 109 is aligned to the gate stacks 106 and the gate spacers 108, it is also referred to as a self-aligned capping (SAC) layer 109. In some discussion, a gate stack 106, the gate spacers 108 on sidewalls of the gate stack 106, and the SAC layer 109 on top of the gate stack 106 may be considered as one gate structure.

Figure 7:
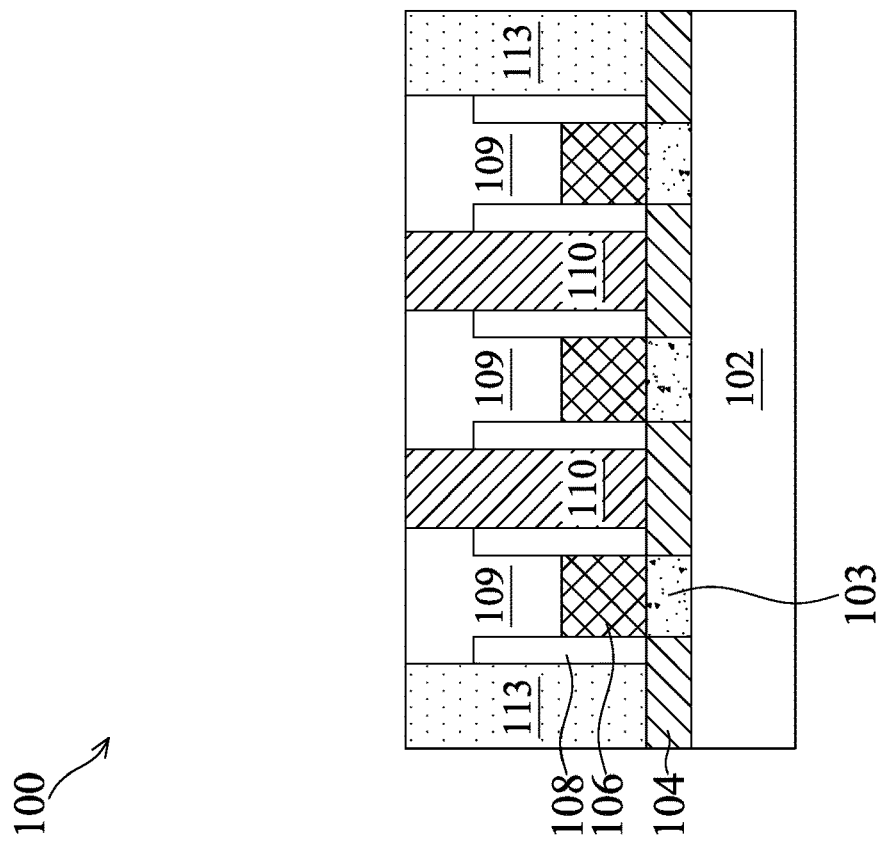

At operation 16, the method 10 (FIG. 1A) forms S/D contacts 110 on the S/D features 104, such as shown in FIG. 7. In an embodiment, operation 16 includes forming an etch mask using photolithography processes, the etch mask having openings corresponding to where S/D contacts 110 are to be etched. Subsequently, operation 16 etches the dielectric layer(s) 113 through the etch mask to form S/D contact holes. The one or more etching processes may include dry etching, wet etching, reactive ion etching, or other suitable etching. In some embodiments, the openings of the etch mask may expose the dielectric layer(s) 113 as well as some of the SAC layer 109. To further those embodiments, the etching process is tuned to selectively etch the dielectric layer(s) 113 with no (or minimal) etching to the SAC layer 109 and the gate spacers 108. As a result, contact holes are formed and the S/D features 104 are exposed through the contact holes. The etch mask is subsequently removed and the S/D contacts 110 are formed in the contact holes. The S/D contacts 110 may include one or more metallic materials such as tungsten (W), cobalt (Co), ruthenium (Ru), other metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes. In some embodiments, the S/D contacts 110 include a layer of metal nitride (e.g., TiN, TiAlN, WN, or TaN) and a layer of metal (e.g., W, Co, or Ru) over the layer of the metal nitride. To further these embodiments, the layer of metal nitride makes direct contact with the surfaces of the gate spacers 108 and the S/D features 104. In some embodiments, even though not illustrated in FIG. 7, the device 100 further includes a silicide feature between the S/D features 104 and the S/D contacts 110. The silicide feature is formed in the contact hole before the S/D contacts 110 are formed. The silicide feature may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Figure 8:
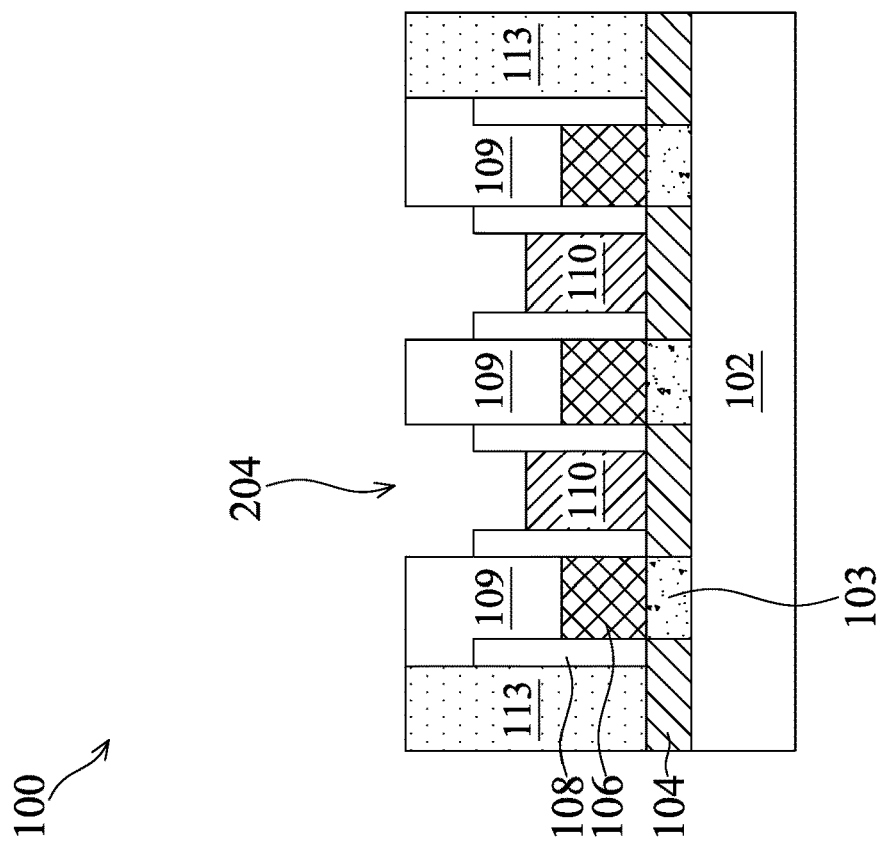

At operation 18, the method 10 (FIG. 1A) etches back the S/D contacts 110 to form trenches 204, such as shown in FIG. 8, in preparation for forming a self-aligned capping layer (for example, the layer 111 in FIG. 12) over the S/D contacts 110. In an embodiment, operation 18 includes forming an etch mask (similar to the etch mask formed in operation 16) to define openings for etching the S/D contacts 110. Subsequently, operation 18 includes one or more etching processes that are tuned to etch the S/D contacts 110 with no (or minimal) etching to the dielectric layer 113 and the gate spacers 108. The one or more etching process may also etch the SAC layer 109. The one or more etching processes may include dry etching, wet etching, reactive ion etching, or other suitable etching. As a result, the S/D contacts 110 are recessed such that their top surfaces are below the top surface of the gate spacers 108 in the present embodiment, resulting in T-shaped trenches 204. As shown in FIG. 8, the top surface of the S/D contacts 110, some sidewall surfaces of the SAC layer 109, the top surface of the gate spacers 108, and some sidewall surface of the gate spacers 108 are exposed in the trenches 204.

Figure 9:
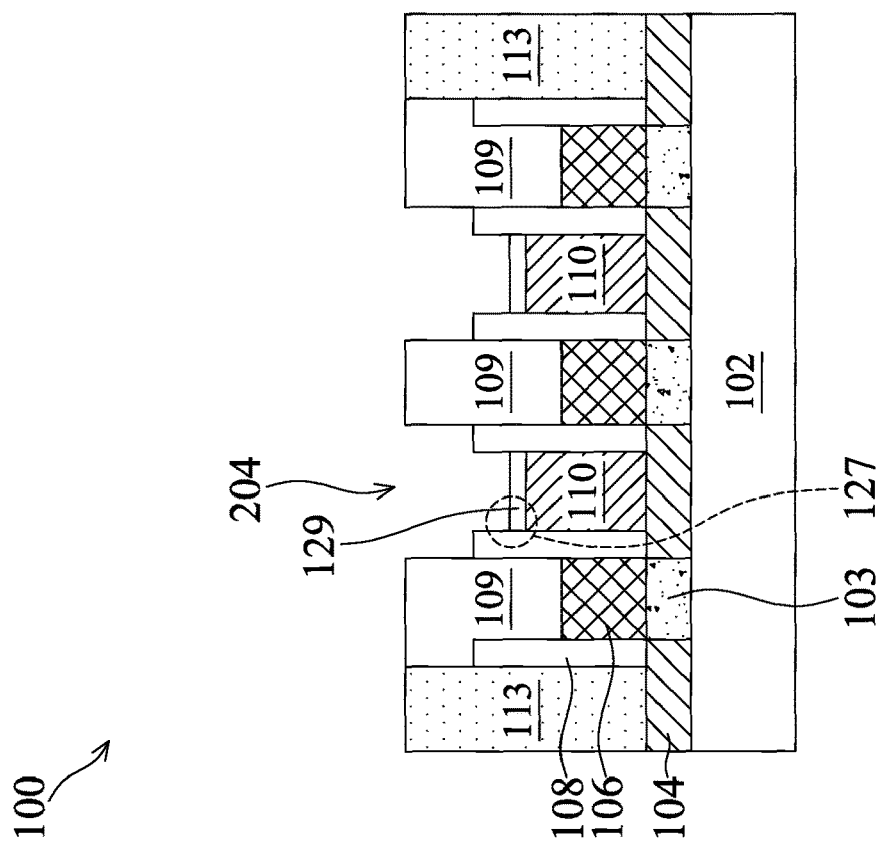

At operation 20, the method 10 (FIG. 1A) selectively deposits an inhibitor layer 129 on the S/D contacts 110, such as shown in FIG. 9. The inhibitor layer 129 includes an organic or organic-like film that includes amphiphilic or amphiphilic-like molecules. Referring to FIG. 9, the inhibitor layer 129 is deposited on the top surface of the S/D contacts 110, but not on the dielectric layers 113, 109, and 108. It is noted that the inhibitor layer 129 may or may not touch the gate spacers 108 in corner areas 127 where the gate spacers 108 and the S/D contacts 110 meet. In an embodiment, the inhibitor layer 129 is deposited on the surface of the S/D contacts 110 due to covalent bonds between the molecules of the S/D contacts 110 and the molecules of the inhibitor layer 129. Such covalent bonds do not exist between the dielectric surfaces of the layers 113, 109, and 108 and the inhibitor layer 129. Thus, the inhibitor layer 129 is not deposited over these dielectric surfaces. The inhibitor layer 129 further has a hydrophobic property such that it is not attachable to a dielectric material (i.e., it repels the deposition of a dielectric material thereon), which will be further explained with reference to the operation 22. For example, the inhibitor layer 129 may include a compound of alkyl chain or carboxylic acid in some embodiment or may have a chemical formula of $SHCH_2C_6H_4CH_2SH$, or $HS—(CH_2)_n—COOH$ in some embodiment. The inhibitor layer 129 may be deposited using ALD, PVD, CVD, or other suitable methods and may have a thickness (along the "z" direction) of about 0.5 nm to 15 nm in some embodiments. The thickness of the inhibitor layer 129 determines the size of a gap between the S/D contacts 110 and a liner layer (such as the liner layer 132) to be formed in a later step. As will be discussed later, the gap is filled with an S/D contact via to be formed in a later step. If the inhibitor layer 129 is too thin (such as less than 0.5 nm), then the gap would be too small to be filled by the S/D contact via in some instances. This would inadvertently reduce the interfacial area between the S/D contact 110 and the via. The inhibitor layer 129 cannot be too thick either (such as more than 15 nm) because its thickness is limited by the height differential between the gate spacers 108 and the S/D contact 110. To form a thick inhibitor layer 129, the S/D contact 110 would be recessed too much, which would adversely increase the S/D contact resistance. Therefore, the thickness of the inhibitor layer 129 is controlled to be in the range of about 0.5 nm to about 15 nm in the present embodiment. In the present embodiment, the top surface of the inhibitor layer 129 is below the top surface of the gate spacers 108. In some embodiments, the top surface of the inhibitor layer 129 may be even with or slightly higher than the top surface of the gate spacers 108. Since the inhibitor layer 129 is deposited only on selected surfaces (i.e., the surfaces of the S/D contacts 110) without involving a photolithography process. Thus, the operation 20 is a selective deposition process.

Figure 10:
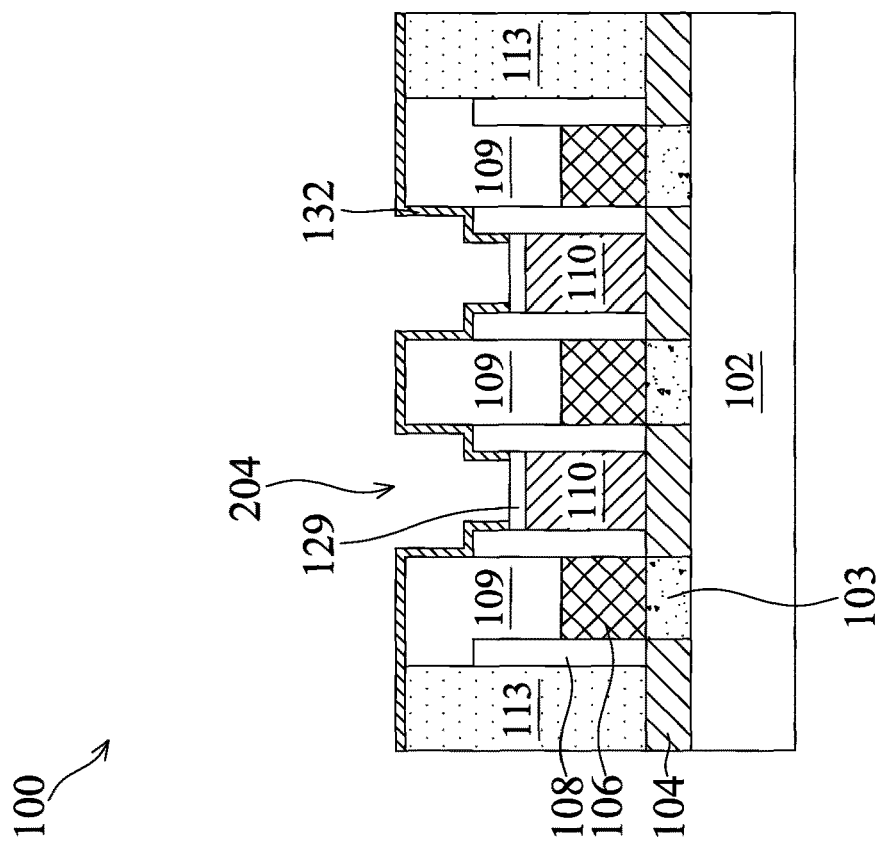

At operation 22, the method 10 (FIG. 1A) selectively deposits a liner layer 132 on sidewalls of the trenches 204 and on the top surface of the dielectric layer 113 and the SAC layer 109. Referring to FIG. 10, the dielectric liner layer 132 is deposited to have a substantially uniform thickness along the various surfaces of the dielectric layer 113, the SAC layer 109, and the gate spacers 108. Due to the hydrophobic property of the inhibitor layer 129, the liner layer 132 is free from at least the central portion of the inhibitor layer 129. The liner layer 132 may or may not touch the edge areas of the inhibitor layer 129 (i.e., the portion of the inhibitor layer 129 at the corners 127) in various embodiments. In various embodiment, the liner layer 132 may include a dielectric material such as $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The liner layer 132 may be deposited using ALD, CVD, or other suitable methods, and may have a thickness of about 0.5 nm to about 15 nm (e.g., as measured on the sidewalls of the SAC layer 109 or the gate spacers 108 along the "x" direction) in various embodiments. In the present embodiment, the liner layer 132 is deposited only on selected surfaces (i.e., the surfaces of the dielectric layer 113, the SAC layer 109, and the gate spacers 108) without involving a photolithography process. Thus, the operation 22 is a selective deposition process. Particularly, since the liner layer 132 is not deposited on the inhibitor layer 129, a vertical etching process for breaking down the liner layer 132 is avoided, which solves the issues discussed earlier with respect to other approaches.

Figure 11:
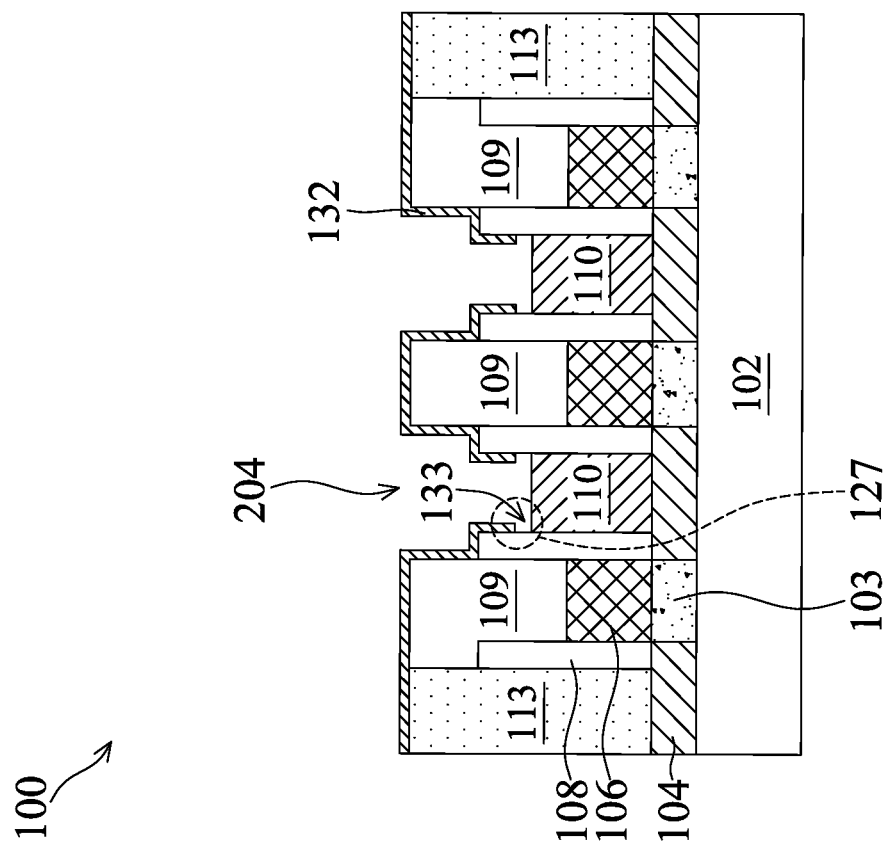
Figure 13:
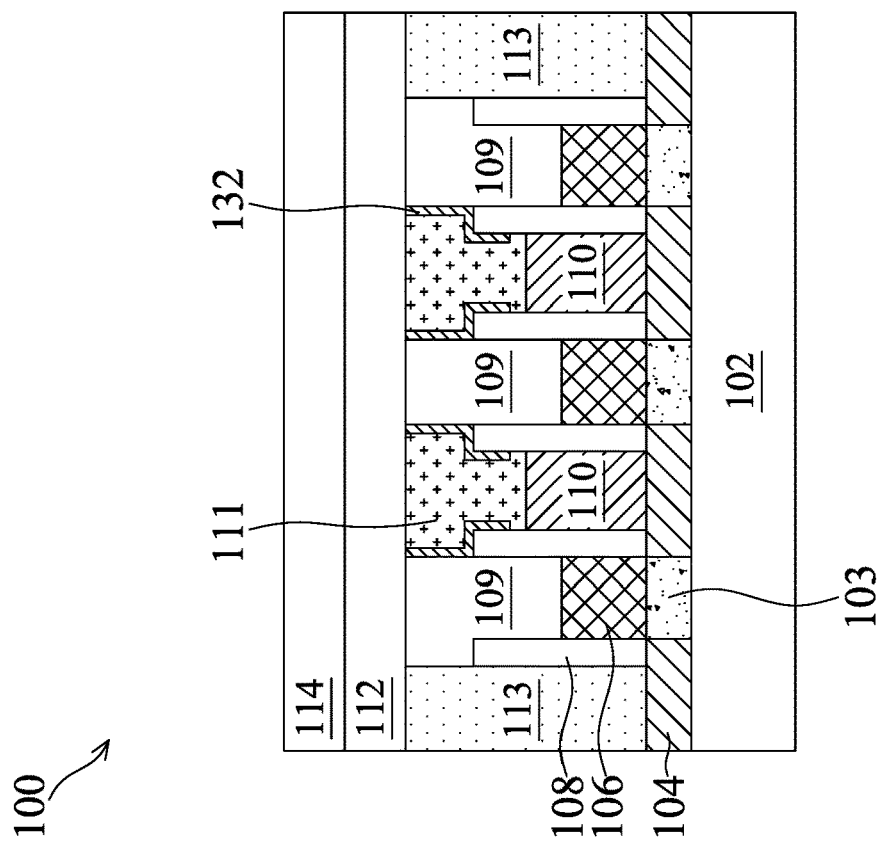

At operation 24, the method 10 (FIG. 1A) removes the inhibitor layer 129 from the device 100. Referring to FIG. 11, the removal of the inhibitor layer 129 results in gaps (or voids) 133 in the corner areas 127 where the S/D contacts 110 and the gate spacers 108 meet. In the cross-sectional view of FIG. 11, the gaps 133 exist directly below the liner layer 132 and above the S/D contacts 110 and expose a portion of the side surface of the gate spacers 108. In an embodiment, the removal of the inhibitor layer 129 includes a plasma dry etching process, a chemical dry etching process, an ashing process, a wet etching process, or a combination thereof. The etching and ashing processes are selective to the materials of the inhibitor layer 129 and have no (or minimal) etching to the liner layer 132, the gate spacers 108, and the S/D contacts 110. For example, the plasma dry etching process may use conventional dry etchant for dielectric material such as $C_4F_6$ mixed with $H_2$ or $O_2$, the chemical dry etching process may use one or more chemicals such as $H_2$, the ashing process may use oxygen or hydrogen ashing, and the wet etching process may apply a hot SPM solution (a mixture of sulfuric acid and hydrogen peroxide), for example, at a temperate above 100° C.

As a result of the operations 20, 22, and 24, the top surface of the S/D contacts 110 are exposed in trenches 204 and the liner layer 132 is disposed over various surfaces of the dielectric layer 113, the SAC layer 109, and the gate spacers 108. In approaches that do not use the inhibitor layer 129, the liner layer 132 would be deposited also on the S/D contacts 110. In order to expose the S/D contacts 110 for subsequent electrical connection to S/D contact vias, an etching process would be performed to etch the liner layer 132. Sometimes, to ensure that the liner layer 132 is completely removed from the surfaces of the S/D contacts 110, an over-etching would be performed. The over-etching may lead to unnecessary loss of the S/D contacts 110, which would increase the S/D contact resistance. Further, these etching processes sometimes also partially remove the gate spacers 108, leading to short circuit between the gate stack 106 and the S/D features 104 due to metal leakage over time. In contrast, by using the inhibitor layer 129, processes according to the present embodiment are more robust and have better control on the volume of the S/D contacts 110. Further, due to the presence of the gaps 133, there are more areas of the S/D contacts 110 for making S/D contact vias, thereby reducing S/D contact resistance.

Figure 12:
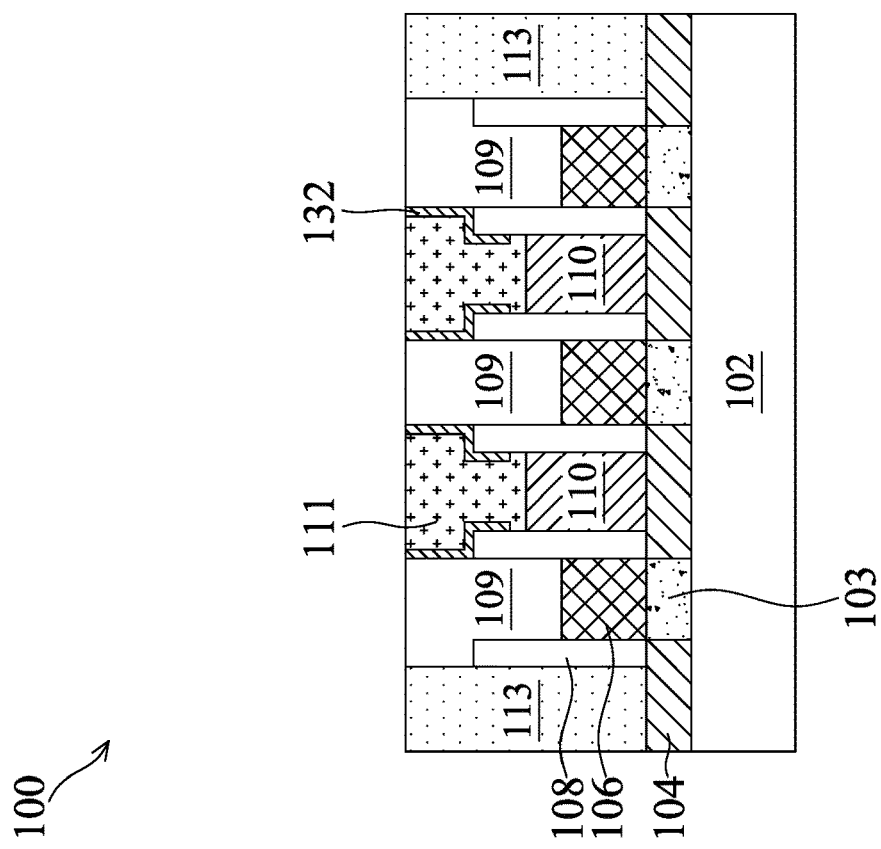

At operation 26, the method 10 (FIG. 1B) forms a capping layer 111 in the trenches 204, such as shown in FIG. 12. In an embodiment, operation 26 includes depositing one or more dielectric materials into the trenches 204 and performing a CMP process to the one or more dielectric materials and the liner layer 132, thereby removing them from the top of the dielectric layer 113 and the SAC layer 109. The one or more dielectric materials remaining in the trenches 204 become the capping layer 111. The capping layer 111 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be deposited by atomic layer deposition (ALD), CVD, and/or other suitable methods. Since the capping layer 111 is aligned to the S/D contacts 110 and the gate spacers 108, it is also referred to as a self-aligned capping (SAC) layer 111. Due to the presence of the liner layer 132 and the gap 133 (FIG. 11), the middle section of the SAC layer 111 is narrower than the sections above and below, giving the SAC layer 111 a dumbbell shape. In some embodiments, the material(s) in the SAC layer 111 is selected to be different than the material(s) in the SAC layer 109 to achieve etch selectivity in a later step. In some embodiments, the material(s) in the SAC layer 111 is selected to be different than the material(s) in the gate spacers 108 to achieve etch selectivity in a later step. In some embodiments, the material(s) in the SAC layer 111 is selected to be different than the material(s) in the liner layer 132 to achieve etch selectivity in a later step. These will be further discussed below.

At operation 28, the method 10 (FIG. 1B) forms another CESL 112 over the layers 113, 109, 132, and 111, and forms another ILD layer 114 over the CESL 112. The CESL 112 may comprise silicon nitride, silicon oxynitride, silicon nitride with oxygen (O) or carbon (C) elements, and/or other materials; and may be formed by CVD, PVD, ALD, or other suitable methods. The ILD layer 114 may comprise tetraethylorthosilicate (TEOS) oxide, un-doped silicate glass, or doped silicon oxide such as borophosphosilicate glass (BPSG), fluoride-doped silicate glass (FSG), phosphosilicate glass (PSG), boron doped silicate glass (BSG), and/or other suitable dielectric materials. The dielectric layer 114 may be formed by PECVD (plasma enhanced CVD), FCVD (flowable CVD), or other suitable methods.

Figure 14:
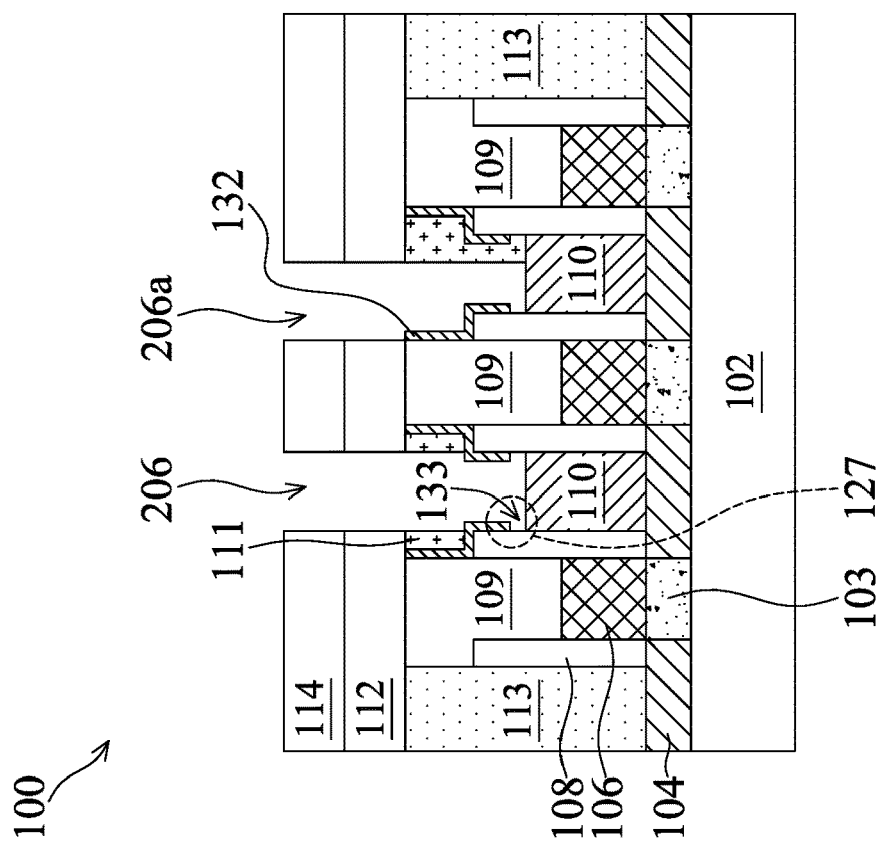

At operation 30, the method 10 (FIG. 1B) etches via holes 206 through the layers 114, 112, and 111, exposing the S/D contacts 110, such as shown in FIG. 14. In an embodiment, operation 30 includes forming an etch mask (such as using a photolithography process) over the device 100, where the etch mask includes openings corresponding to the via holes 206. Subsequently, operation 30 includes one or more etching processes that are tuned to etch the ILD layer 114, the CESL 112, and the SAC layer 11 and with no (or minimal) etching to the S/D contacts 110, the liner layer 132, and the gate spacers 108. In an embodiment, the material(s) in the SAC layer 111 is selected to be different than the material(s) in the liner layer 132 and the gate spacer 108 to achieve the desired etch selectivity. Particularly, the etch selectivity between the SAC layer 111 and the gate spacers 108 is designed to be high enough such that the gaps 133 are reclaimed with no (or minimal) loss of the gate spacers 108. This ensures a wide top surface of the S/D contacts 110 for connecting to a via (later formed), thereby reducing S/D contact resistance. This also ensures the gate spacers 108 are maintained thick enough to ensure the device 100's TDDB performance. In some embodiments, such as shown in FIG. 14, some of the openings in the etch mask may be misaligned with the S/D contacts 110, and the resultant via hole 206a is misaligned. To account for these cases, the etch selectivity between the SAC layer 111 and the liner layer 132 is designed to be high enough such that the SAC layer 109 and the top of the gate spacers 108 are protected during the etching processes. Otherwise, the SAC layer 109 and the gate spacers 108 would suffer loss of thickness, leading to degraded TDDB performance. In various embodiments, the one or more etching processes may include dry etching, wet etching, reactive ion etching, or other suitable etching.

Figure 15:
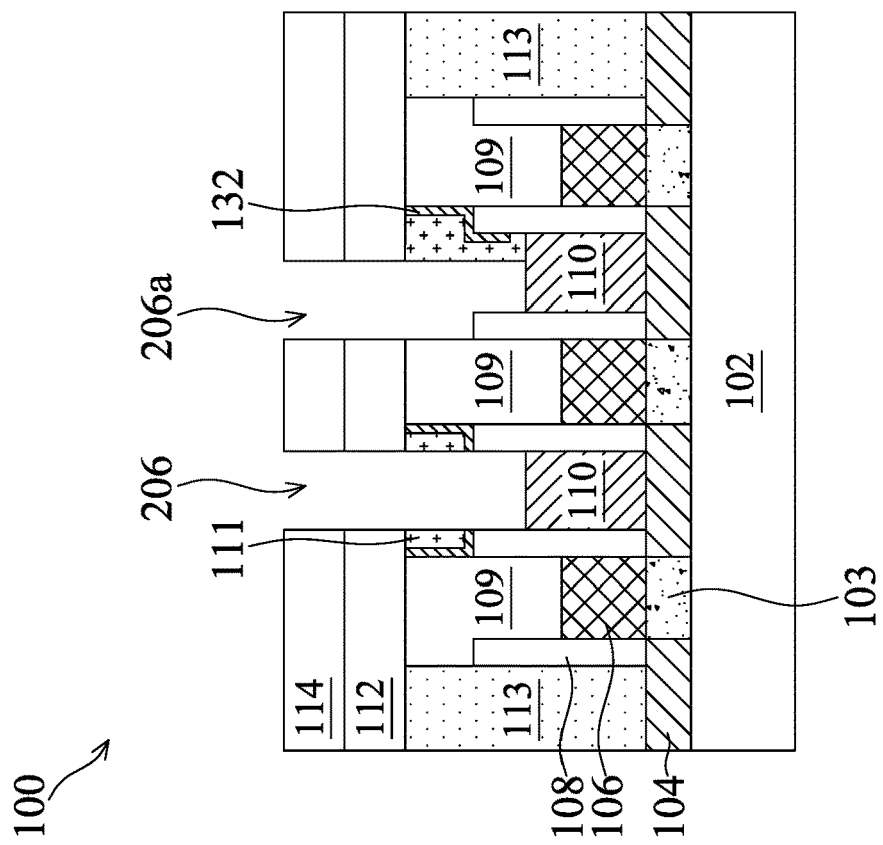

At operation 32, the method 10 (FIG. 1B) optionally removes any portions of the liner layer 132 that are exposed in the via holes 206 (including 206*a*), such as shown in FIG. 15. For example, operation 32 may perform an etching process that is tuned to remove the liner layer 132 with no (or minimal) etching to the SAC layer 111, the gate spacers 108, and the SAC layer 109. Operation 32 may partially etch the ILD layer 114 and the CESL 112. The etching process may include a dry etching, wet etching, reactive ion etching, or other suitable etching. In some embodiments, the method 10 omits or skips the operation 32 depending on design objectives. The considerations for whether to include operation 32 in the method 10 are discussed in conjunction with the next operation.

Figure 17:
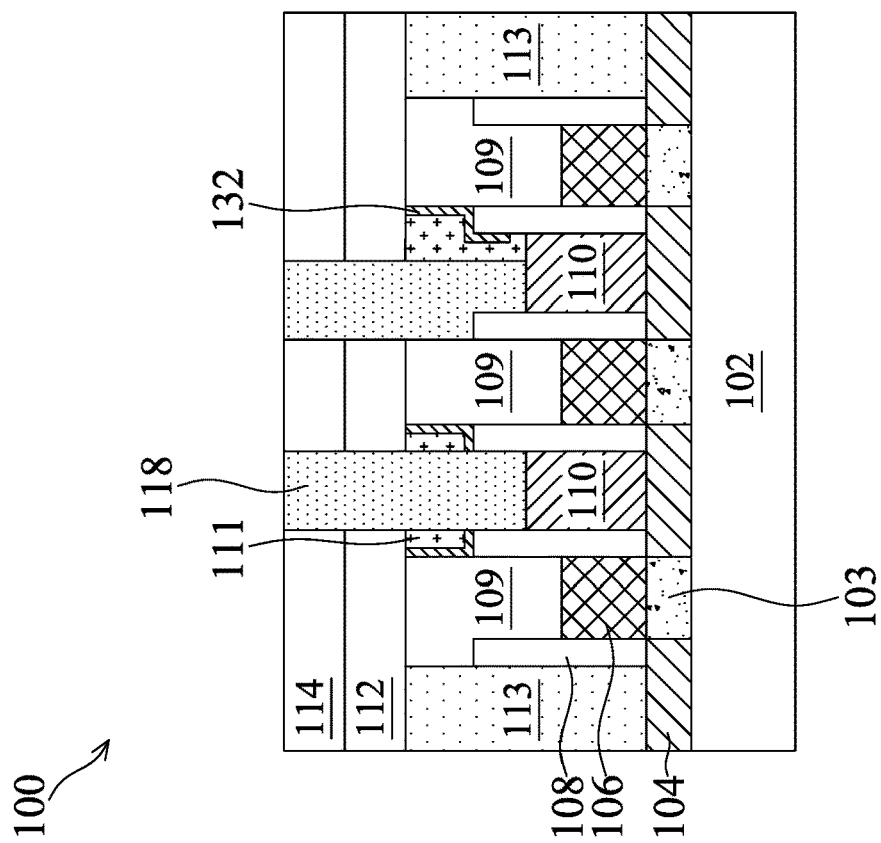
Figure 16:
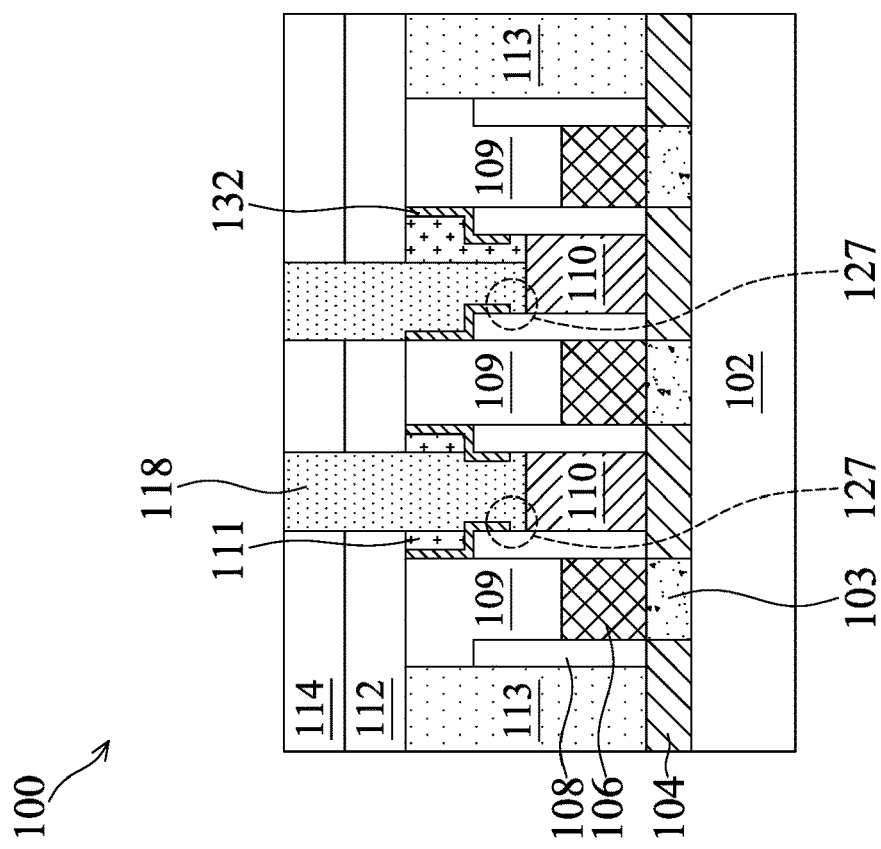

At operation 34, the method 10 (FIG. 1B) forms S/D contact vias 118 in the via holes 206, such as shown in FIGS. 16 and 17. FIG. 16 corresponds to the embodiment where operation 32 is performed, and FIG. 17 corresponds to the embodiment where operation 32 is omitted or skipped. In an embodiment, operation 34 includes depositing one or more conductive materials into the via holes 206 and performing a CMP process to remove excessive portions of the conductive material(s) and to planarize the top surface of the device 100. The portions of the conductive material(s) remaining in the via holes 206 become the S/D contact vias 118. The S/D contact vias 118 may include copper, aluminum, tungsten, cobalt, ruthenium, a metal nitride (e.g., TiN, TaN, or WN), or other suitable materials; and may be deposited using ALD, PVD, CVD, plating, or other suitable methods. In the present embodiment, the S/D contact vias 118 are deposited to fill the gaps 133 (see FIG. 14), which advantageously increases the interfacial area between the S/D contact vias 118 and the S/D contacts 110 and reduces the contact resistance. The embodiment in FIG. 16 and the embodiment in FIG. 17 each has its own merits and can be selected based on design objectives. For example, by removing the liner layer 132 within the via holes 206 (FIGS. 15 and 17), the volume of the S/D contact vias 118 are increased, which advantageously reduces the resistance of the via 118. On the other hand, by keeping the liner layer 132 within the via holes 206 (FIGS. 14 and 16), the distance between the gate stacks 106 and the vias 118 is increased, which reduces the coupling capacitance between the gate stacks 106 and the vias 118 and increases the TDDB performance of the device 100.

At operation 36, the method 10 (FIG. 1B) performs further fabrication to the device 100. For example, it may perform various processes to form gate vias electrically coupled to the gate stacks 106 and form metal interconnects connecting the S/D contact vias 118 to other portions of the device 100 to form a complete IC. Further, although the embodiments shown in FIGS. 2A-17 include fins 103 (therefore applicable to FinFETs), the present disclosure is not so limited, and the disclosed technologies can be applied to planar transistors or other types of multi-gate transistors such as nanosheet or nanowire transistors for improving the robustness of S/D contact via structure and formation.

In some embodiments, the method 10 may perform additional fabrication steps between the operation 24 and the operation 26. One such embodiment is shown in FIG. 1C where the method 10 performs the operations 25*a*, 25*b*, 25*c*, and 25*d* between the operations 24 and 26 to partially remove the liner layer 132. These operations are further described below.

Figures 18, 19:
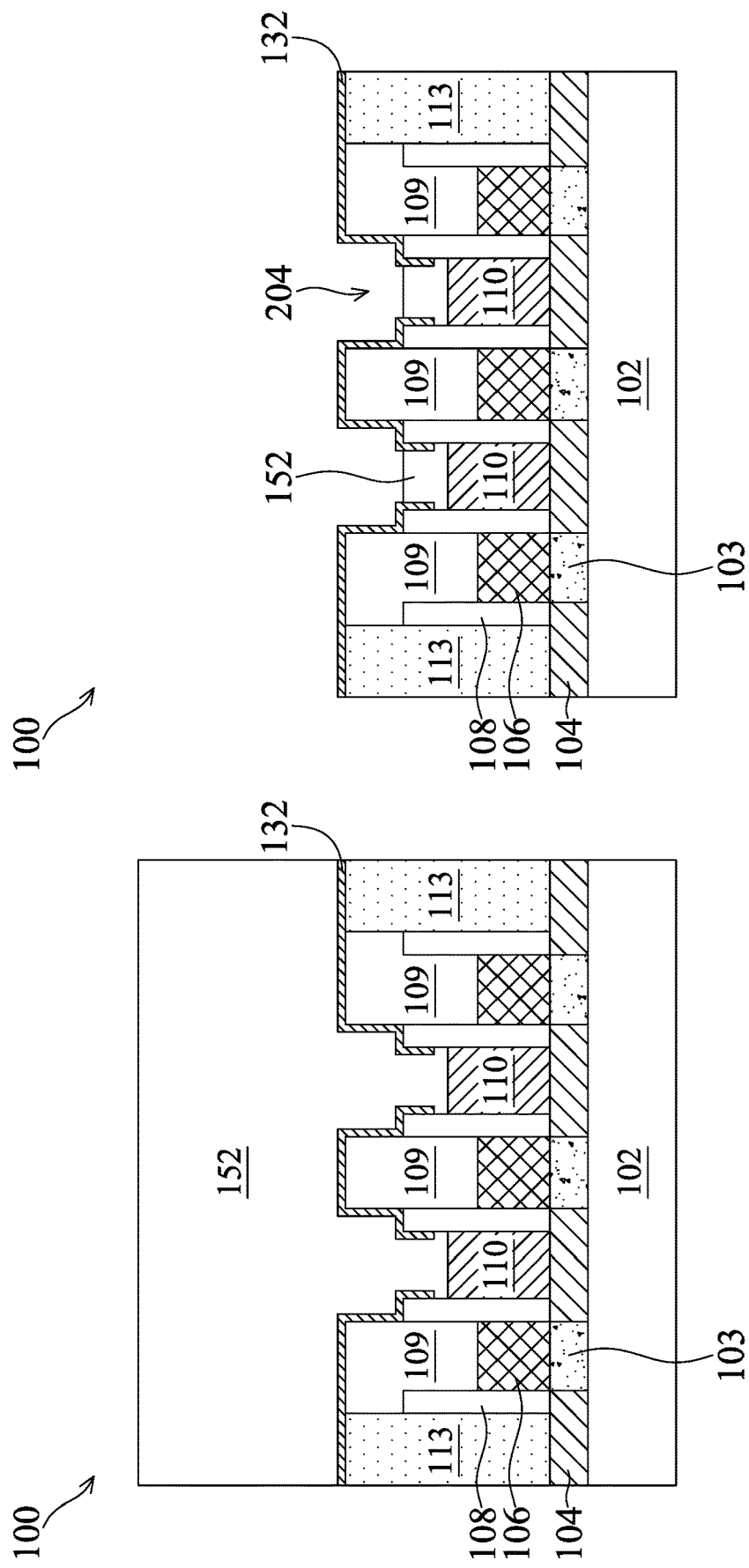
FIGS. 18, 19, 20, 21, 22, 23, 24, 25, 26, and 27 illustrate cross-sectional views of a portion of a semiconductor device along the A-A line in FIGS. 2A and 2B, according to some embodiments, in intermediate step of fabrication according to an embodiment of the method of FIGS. 1A, 1C.

After removing the inhibitor layer 129 at the operation 24 (FIG. 1A and FIG. 11), at operation 25*a*, the method 10 (FIG. 1C) deposits a hard mask layer 152 over the device 100. Referring to FIG. 18, the hard mask layer 152 is deposited over the liner layer 132 and filling the trenches 204 (FIG. 11). The hard mask layer 152 may include silicon oxide, silicon nitride, spin-on glass, bottom anti-reflective coating, or other materials. In the present embodiment, the material in the hard mask layer 152 is selected to be different from the materials in the liner layer 132, the dielectric layer 113, the SAC layer 109, the gate spacers 108, and the S/D contacts 110 to achieve etch selectivity as discussed below. The hard mask layer 152 may be deposited using ALD, CVD, PVD, spin-on coating, FCVD, or other suitable methods.

At operation 25*b*, the method 10 (FIG. 1C) etches back the hard mask layer 152. Referring to FIG. 19, the hard mask layer 152 is removed from above the top surfaces of the dielectric layer 113, the SAC layer 109, and the gate spacers 108. The hard mask layer 152 is further recessed inside the trenches 204 such that the top surface of the hard mask layer 152 is about even with the top surface of the gate spacers 108. As a result, the portion of the liner layer 132 that is over the top surface of the dielectric layer 113, the top and sidewall surfaces of the SAC layer 109, and the top surface of the gate spacers 108 is exposed. At least a portion of the liner layer 132 that is over the sidewall surfaces of the gate spacers 108 is covered by the hard mask layer 152. The operation 25*b* may perform an etching process that is tuned to remove the hard mask layer 152 and with no (or minimal) etching to the liner layer 132. The etching process may include a dry etching, wet etching, reactive ion etching, or other suitable etching.

Figure 20:
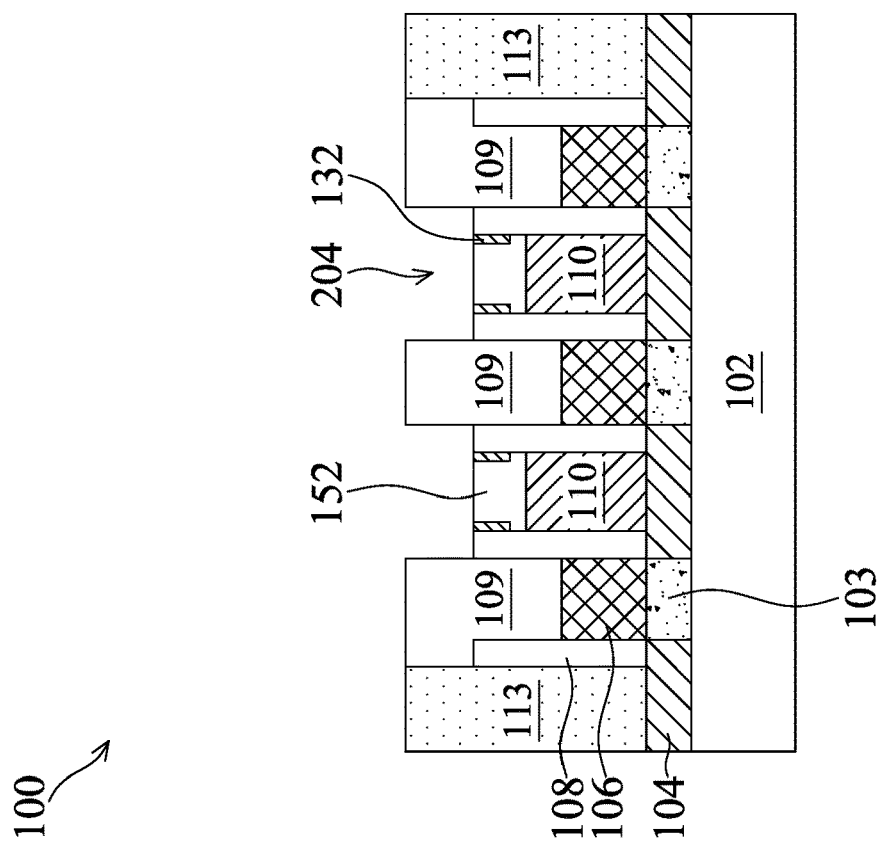

At operation 25*c*, the method 10 (FIG. 1C) etches back the liner layer 132. Referring to FIG. 20, the portion of the liner layer 132 that is not covered by the hard mask layer 152 is removed by an etching process. The etching process may include a dry etching, wet etching, reactive ion etching, or other suitable etching. The etching process is tuned to etch the liner layer 132 and with no (or minimal) etching to the hard mask layer 152, the dielectric layer 113, the SAC layer 109, and the gate spacers 108. In some embodiments, the etching process may slightly etch the dielectric layer 113, the SAC layer 109, and the gate spacers 108.

Figure 21:
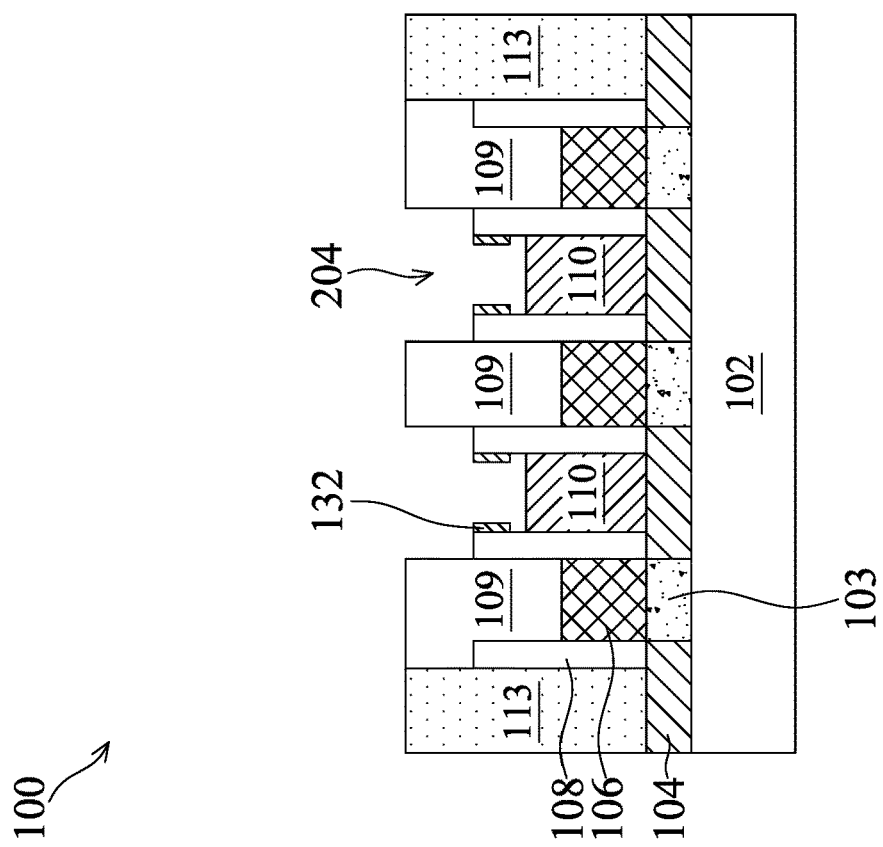

At operation 25*d*, the method 10 (FIG. 1C) removes the hard mask layer 152 from the device 100 by an etching process. The etching process may include a dry etching, wet etching, reactive ion etching, or other suitable etching. The etching process is tuned to etch the hard mask layer 152 and with no (or minimal) etching to the liner layer 132, the dielectric layer 113, the SAC layer 109, the gate spacers 108, and the S/D contacts 110. Referring to FIG. 21, the trenches 204 are reclaimed, and only the portion of the liner layer 132 on the sidewalls of the gate spacers 108 remain in the device 100. In some embodiments, the liner layer 132 contains a high-k dielectric material and the SAC layer 111 (see FIG. 22) has a lower dielectric constant than the liner layer 132, by removing the majority of the liner layer 132 from the trenches 204 and filling the trenches 204 with the SAC layer 111, this embodiment of the method 10 further reduces the coupling capacitance between the gate stacks 106 and the S/D contact vias 118 (see FIGS. 26, 27) to be formed in the trenches 204.

After completing the operation 25d, the method 10 (FIG. 1C) proceeds to the operations 26 through 36 as discussed above with reference to FIG. 1B. Since the structure of the device 100 has been modified by the operations 25a through 25d, the operations 26 through 36 in FIG. 1C are briefly discussed below in conjunction with FIGS. 22 through 27 showing the structure of the device 100 according to some embodiments. Readers are referred to the discussion above for the details of the operations 26 through 36.

Figure 23:
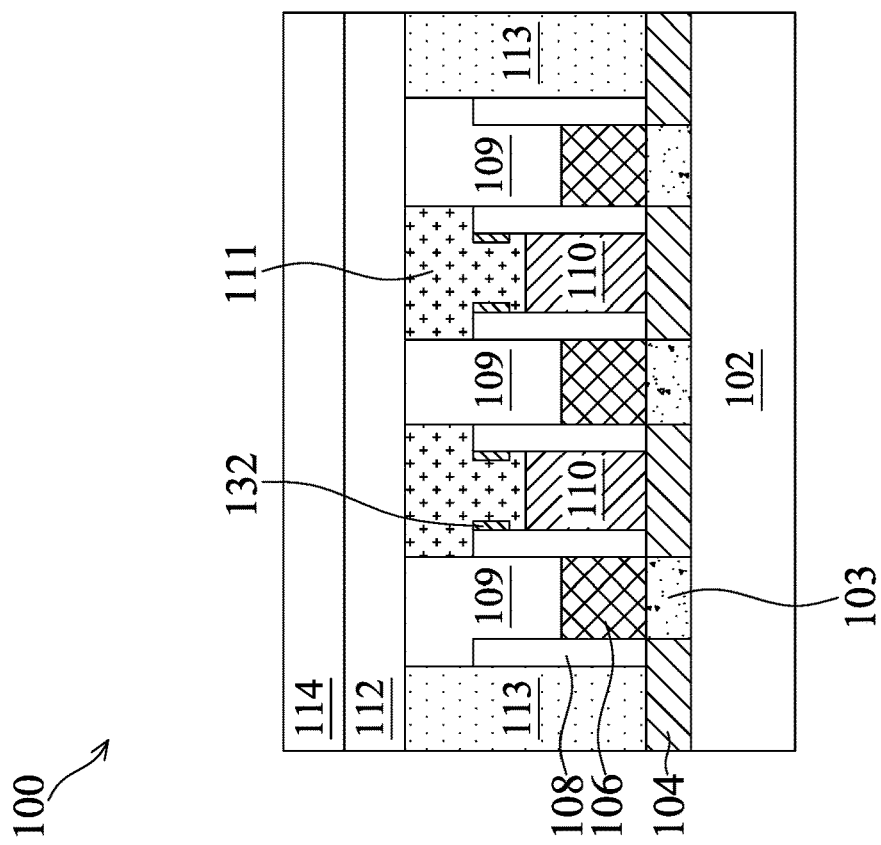
Figure 22:
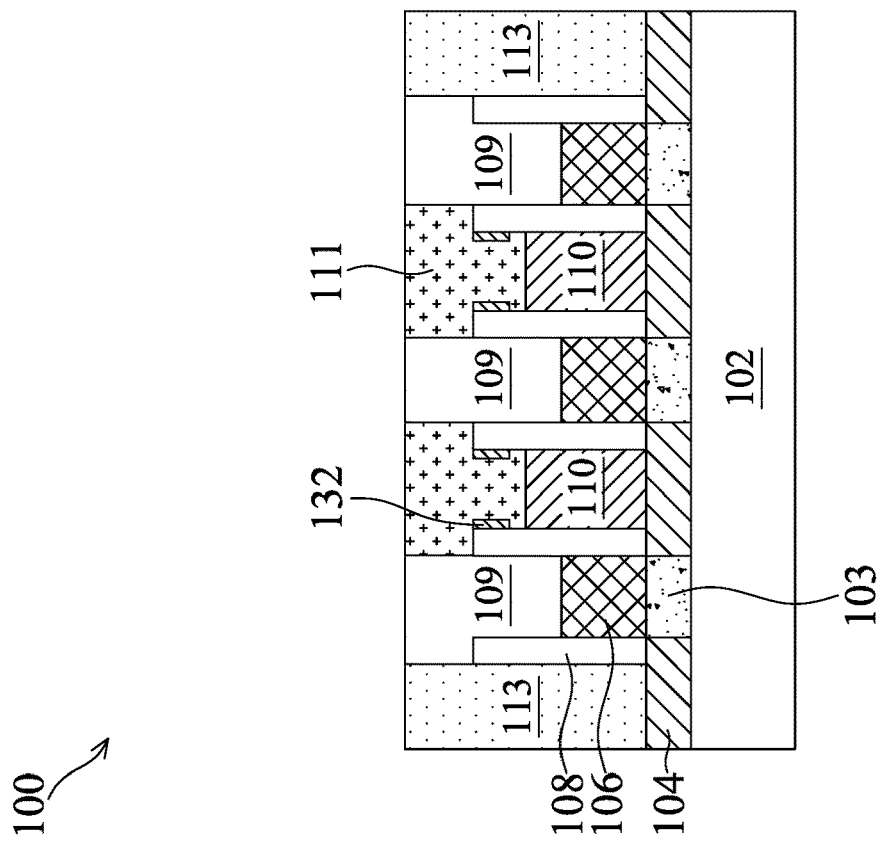
Figure 25:
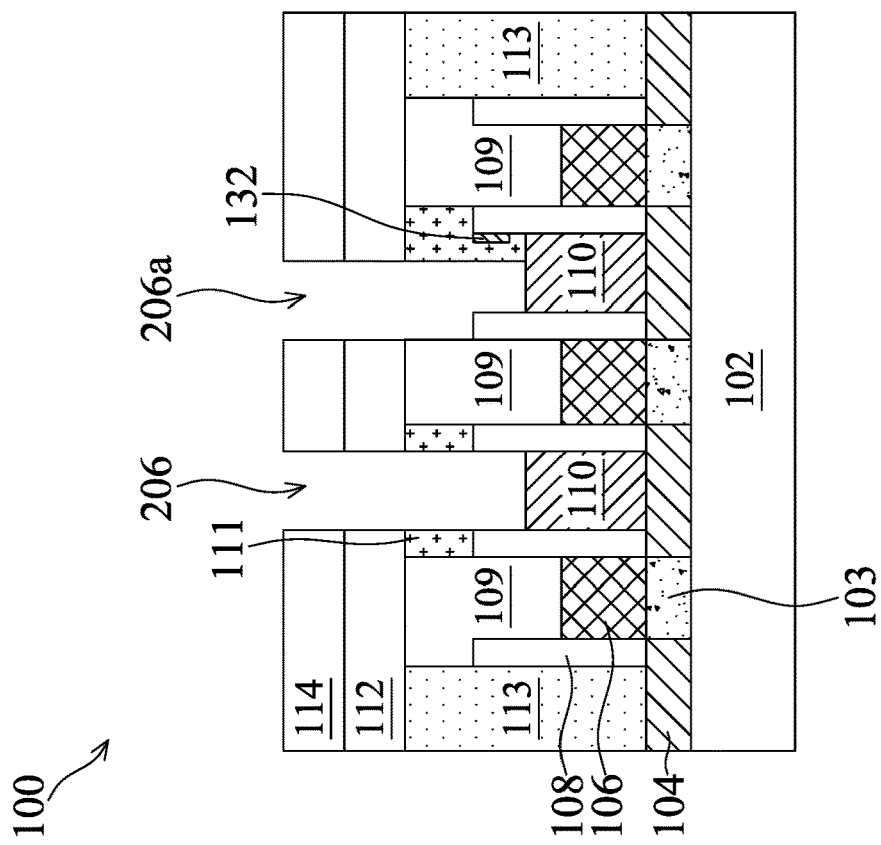
Figure 24:
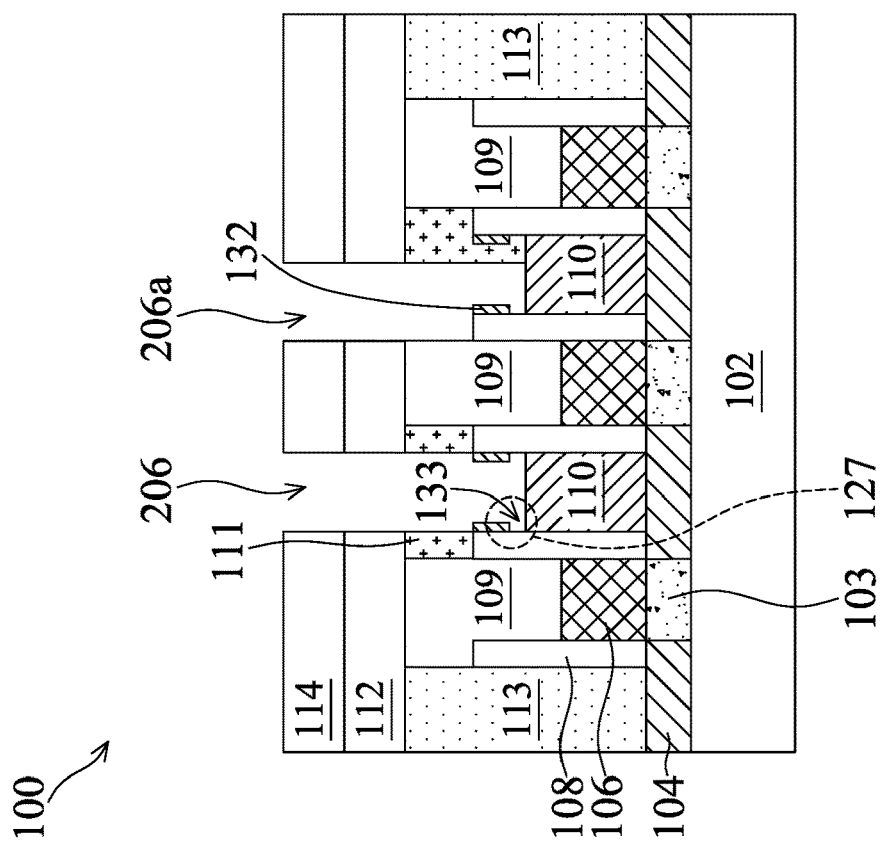
Figure 27:
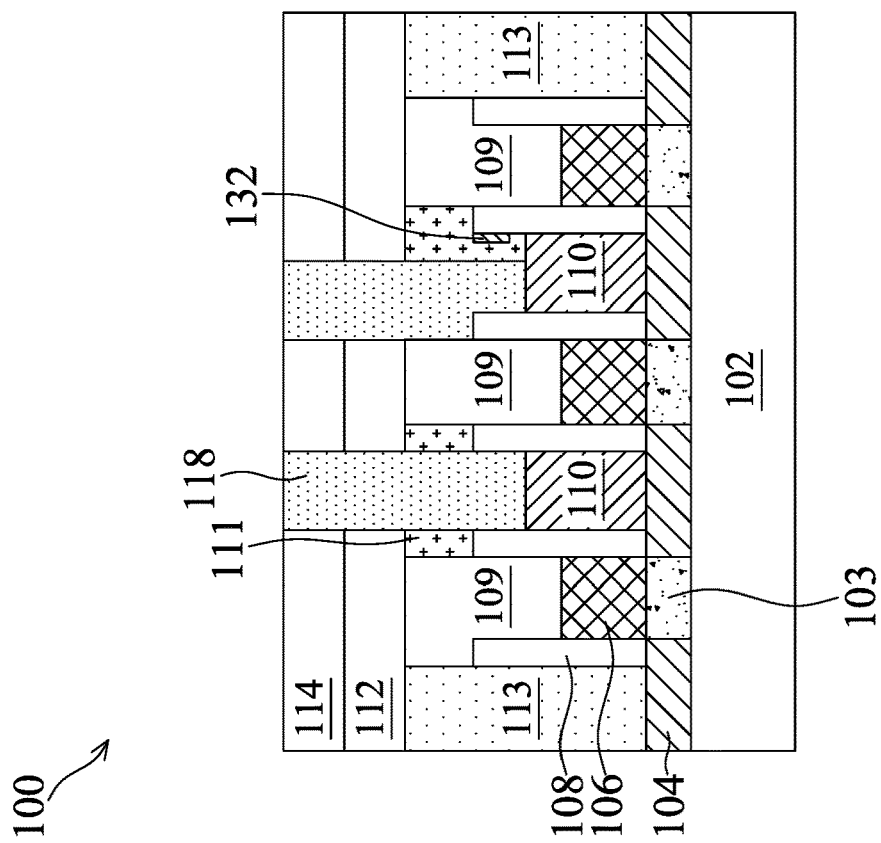
Figure 26:
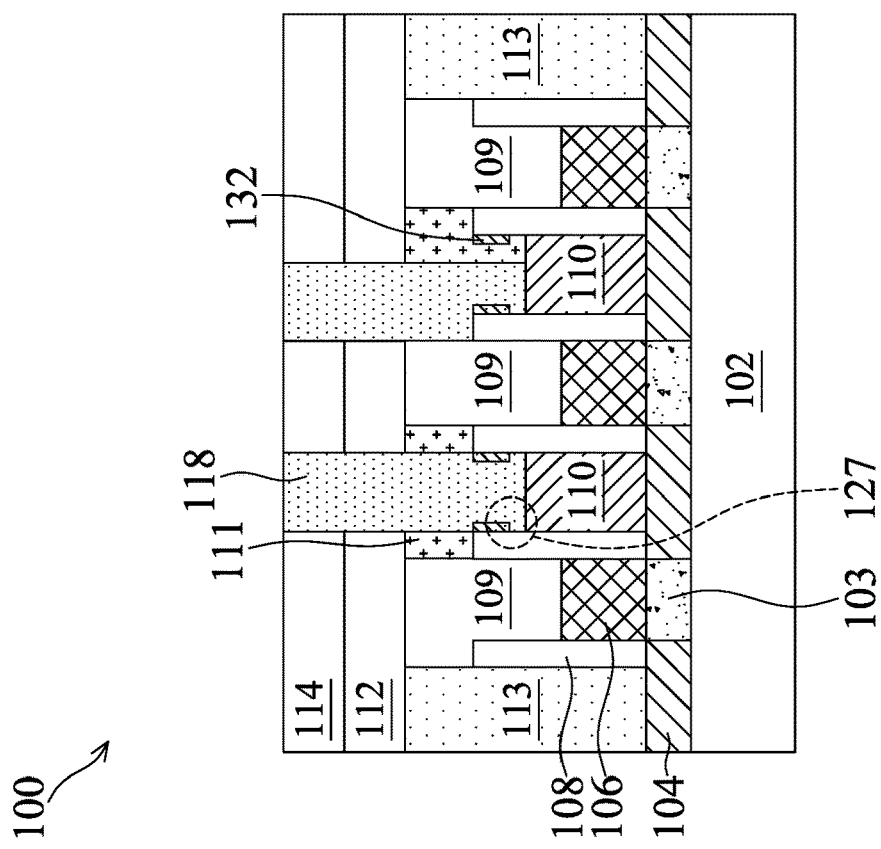

At operation 26, the method 10 (FIG. 1C) forms the SAC layer 111 in the trenches 204, such as shown in FIG. 22. At operation 28, the method 10 (FIG. 1C) forms the CESL 112 over the layers 113, 109, 132, and 111, and forms the ILD layer 114 over the CESL 112, such as shown in FIG. 23. At operation 30, the method 10 (FIG. 1C) etches via holes 206 (including the misaligned via hole 206a) through the layers 114, 112, and 111, exposing the S/D contacts 110, such as shown in FIG. 24. At operation 32, the method 10 (FIG. 1C) optionally removes any portions of the liner layer 132 that are exposed in the via holes 206 (including 206a), such as shown in FIG. 25. At operation 34, the method 10 (FIG. 1C) forms S/D contact vias 118 in the via holes 206, such as shown in FIGS. 26 and 27. FIG. 26 corresponds to the embodiment where operation 32 is performed, and FIG. 27 corresponds to the embodiment where operation 32 is omitted or skipped. At operation 36, the method 10 (FIG. 1C) performs further fabrication to the device 100. For example, it may perform various processes to form gate vias electrically coupled to the gate stacks 106 and form metal interconnects connecting the S/D contact vias 118 to other portions of the device 100 to form a complete IC.

Figure 28:
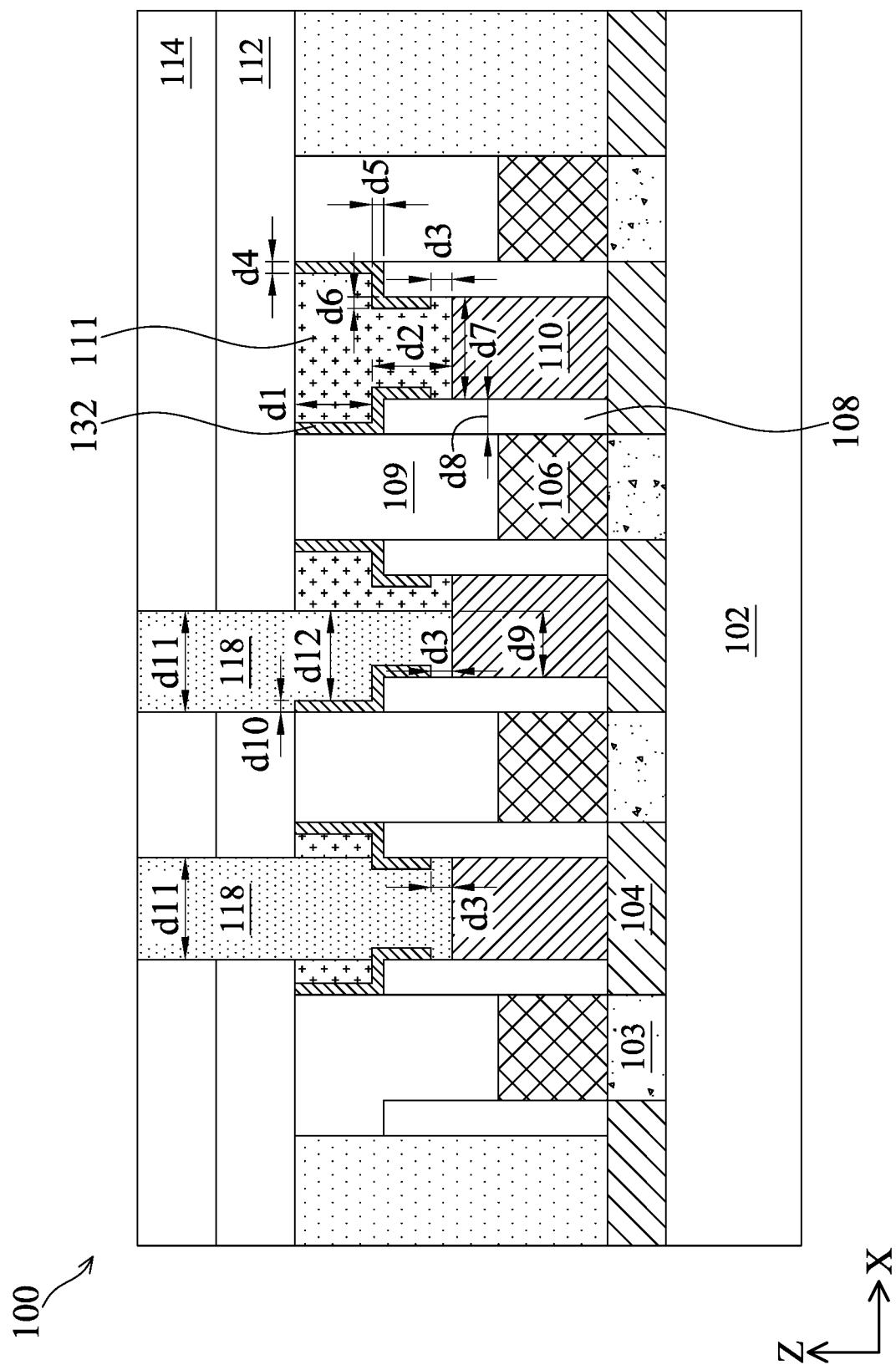
FIGS. 28, 29, 30, 31, 32, 33, and 34 illustrate cross-sectional views of a portion of a semiconductor device along the A-A line in FIGS. 2A and 2B, according to some embodiments.

FIG. 28 illustrates various dimensions of some features of the device 100, according to some embodiments where at least some portion of the liner layer 132 is disposed above the gate spacers 108 (for example, the device 100 is not processed by the operation 25a through 25d). In an embodiment, the dumbbell shaped SAC layer 111 has an upper section that is above the top surface of the liner layer 132 disposed on the top surface of the gate spacers 108. The upper section of the SAC layer 111 has a thickness d1. The SAC layer 111 further includes a lower section that is below the upper section. The lower section of the SAC layer 111 has a thickness d2.

Figure 33:
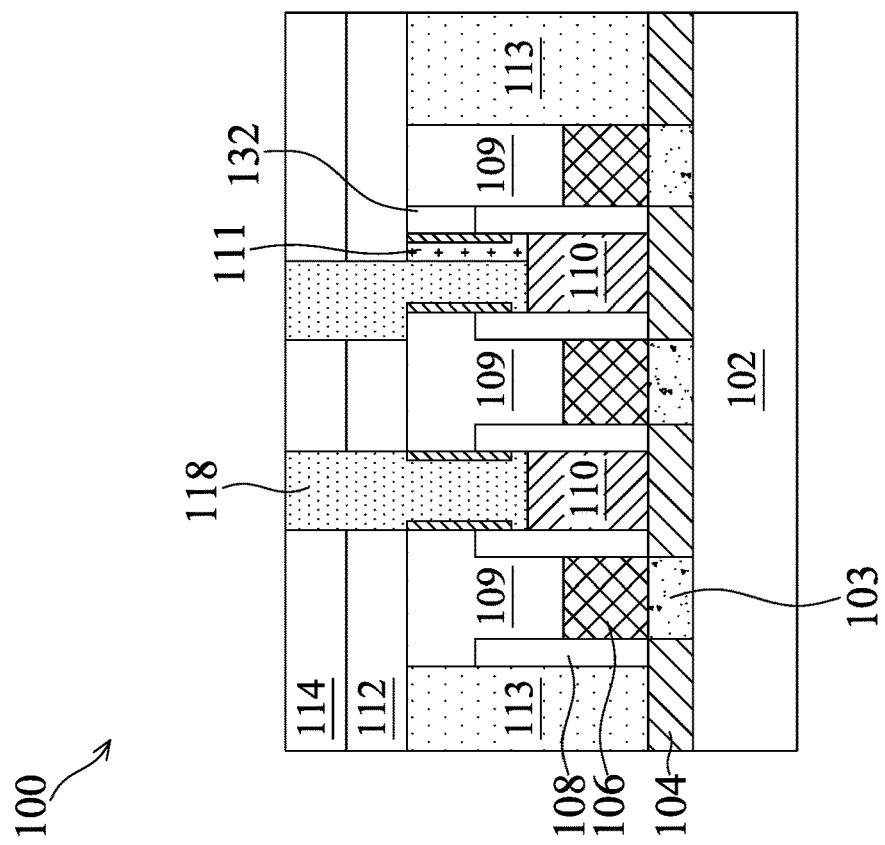
Figure 34:
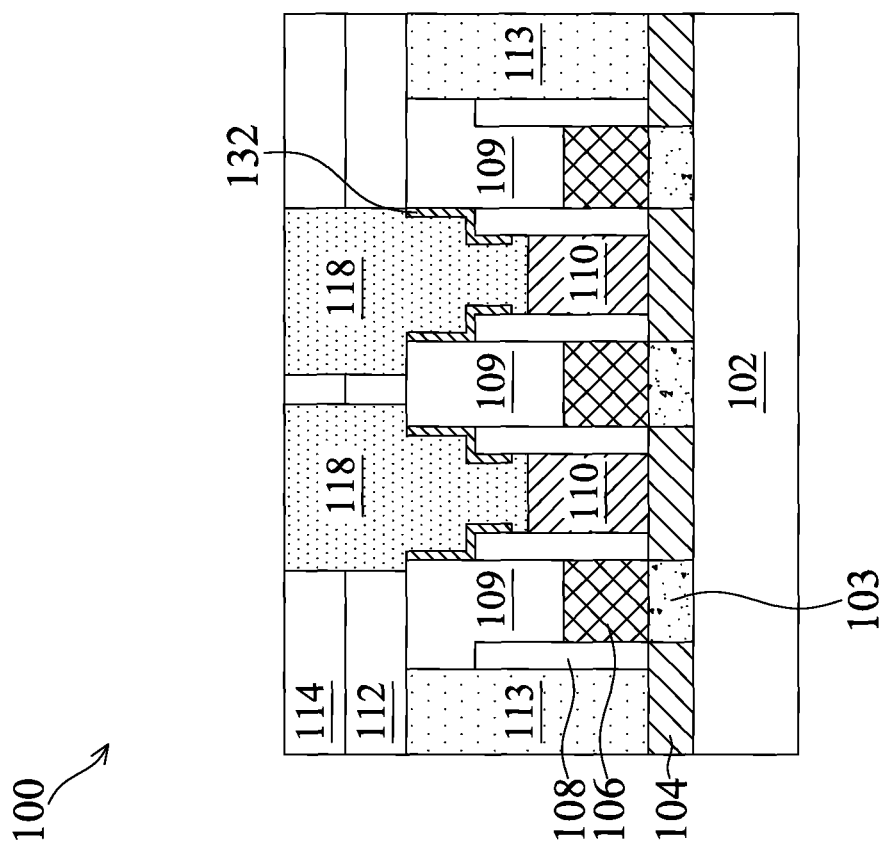

In some embodiment, the upper section of the SAC layer 111 may be completely replaced by the via 118, such as shown in FIG. 33 (the via 118 on the left) and FIG. 34. In embodiments where the upper section of the SAC layer 111 exists, the thickness d1 may be about 0.5 nm to about 30 nm. If the d1 is too big (such as more than 30 nm), the gate spacers 108 might have been recessed too much, leaving the gate stacks 106 and the S/D contacts 110 undesirably short. If the d1 is too small (such as less than 0.5 nm), then the SAC layers 109 and 111 might not be able to protect the gate spacers 108 from various etching processes.

Figure 32:
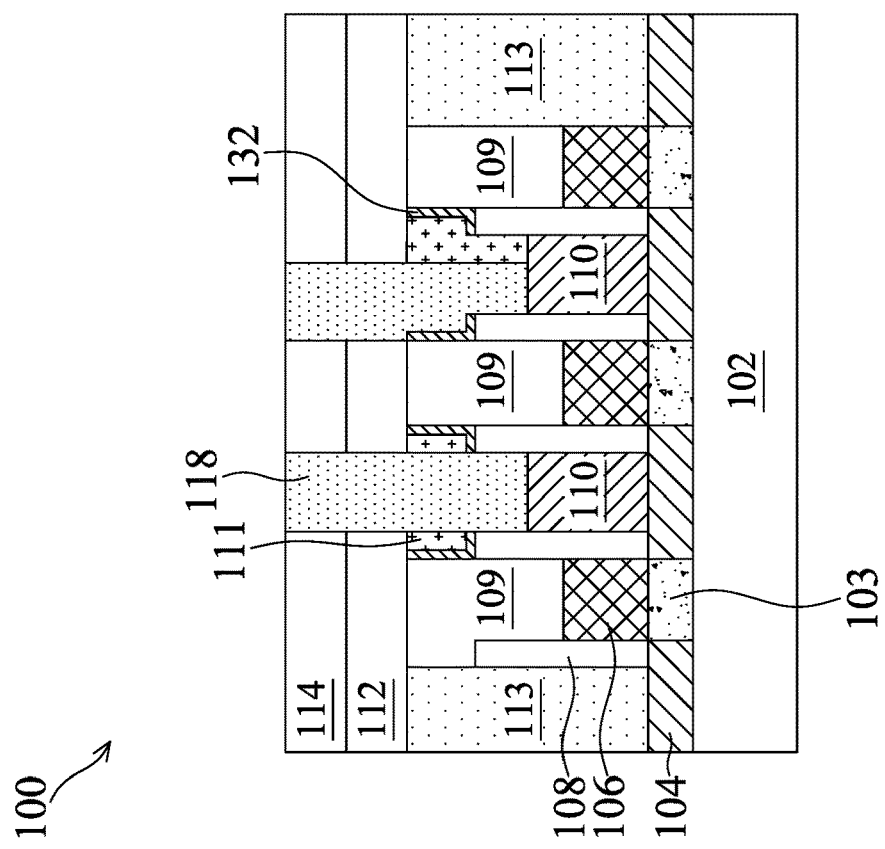

In some embodiment, the lower section of the SAC layer 111 may be completely replaced by the via 118, such as shown in FIG. 28 (the left one of the three SAC layer 111), FIG. 32 (the via 118 on the left), FIG. 33 (the via 118 on the left), and FIG. 34. In embodiments where the lower section of the SAC layer 111 exists, and the thickness d2 may be about 0.5 nm to about 30 nm. If the thickness d2 is too small (such as less than 0.5 nm), the recess of the S/D contact 110 (FIG. 8) might have been insufficient for the deposition of the inhibitor layer 129 (FIG. 9). If the thickness d2 is too large (such as more than 30 nm), the S/D contact 110 would have been recessed too much, which would adversely increase the S/D contact resistance. Therefore, the distance d2 is controlled to be in the range of about 0.5 nm to about 30 nm in the present embodiment.

Still referring to FIG. 28, the distance between the bottom surface of the liner layer 132 and the upper surface of the S/D contact 110 is d3, which is about the same as the vertical dimension of the gap 133 (see FIGS. 11, 14, 24), taking into account any slight modifications by various etching processes discussed above. Further, the gaps 133 may be filled with SAC layer 111 or the vias 118 in various embodiments. The distance d3 may be about 0.5 nm to 15 nm in some embodiments. If the distance d3 is too small (such as less than 0.5 nm), then the gap 133 would be too small to be filled by the SAC layer 111 or the S/D contact via 118 in some instances. This would inadvertently reduce the interfacial area between the S/D contact 110 and the via 118. The distance d3 cannot be too big either (such as more than 15 nm) because it is limited by the height differential between the gate spacers 108 and the S/D contact 110. If the distance d3 is formed too big, the S/D contact 110 would have been recessed too much, which would adversely increase the S/D contact resistance. Therefore, the distance d3 is controlled to be in the range of about 0.5 nm to about 15 nm in the present embodiment.

Still referring to FIG. 28, the portion of the liner layer 132 on the sidewalls of the SAC layer 109 has a thickness d4, the portion of the liner layer 132 on the top surface of the gate spacers 108 has a thickness d5, and the portion of the liner layer 132 on the sidewalls of the gate spacers 108 has a thickness d6. In some embodiments, each of d4, d5, and d6 is about 0.5 nm to about 15 nm. In some embodiments, having the liner layer 132 too thin (such as less than 0.5 nm) might not provide enough etch selectivity during via hole etching, which might lead to adverse loss of the thickness in the gate spacers 108. In some embodiments, the liner layer 132 includes a high-k material and having the liner layer 132 too thick (such as more than 15 nm) might adversely increase the coupling capacitance between the gate stacks 106 and the vias 118.

Still referring to FIG. 28, the top surface of the S/D contacts 110 has a width d7 which may be in the range of about 4 nm to about 30 nm in some embodiments. Having the width d7 too narrow (such as less than 4 nm), then the S/D contact resistance might be too high in some instances. Having the width d7 too wide (such as more than 30 nm) might lower the device integration density in some instances. The gate spacers 108 have a thickness d8, which may be in the range of about 0.5 nm to about 15 nm in some embodiments. Having the thickness d8 too small (such as less than 0.5 nm), the gate spacers 108 might not provide sufficient isolation between the gate stacks 106 and the S/D contacts 110 and the vias 118, leading to degraded TDDB performance. Also, a too thin gate spacer 108 would adversely increase the coupling capacitance between the gate stacks 106 and the S/D contacts 110 and the vias 118. Having the thickness d8 too large (such as more than 15 nm) might lower the device integration density in some instances.

FIG. 28 also illustrates various dimensions of the vias 118. For example, the via 118 has a width d9 at the interface between the via 118 and the S/D contact 110, has a width d11 at the top portion of the via 118 (above the SAC layer 111 and the liner layer 132), and has a width d12 at the middle portion of the via 118 (even with the top surface of the SAC layer 111 and/or the liner layer 132). When the via 118 is misaligned with the S/D contact 110 (such as the via 118 on the right), the portion of the via 118 overlapping with the liner layer 132 has a width d10. In some embodiments, the width d9 is in a range of about 0.5 nm to about 30 nm, such as from about 0.5 nm to about 20 nm. If the width d9 is too small (such as less than 0.5 nm), then the interfacial area between the via 118 and the S/D contact 110 might be too small, leading to increased S/D resistance. So, the width d9 is desired to be as large as possible. However, the upper limit of the width d9 is limited by the width d7 discussed above. In some embodiments, the width d10 is equal to or smaller than the thickness d4 discussed above to leave enough room above the SAC layer 109 for forming gate vias. For example, the width d10 may be in a range of 0.5 nm to about 10 nm. In some embodiments, each of the width d11 and d12 may be in a range of about 0.5 nm to about 30 nm. If the width d11 and d12 are too small (such as less than 0.5 nm), then via 118 might have too small volume and too high resistance for some applications. So, the width d11 and d12 are desired to be as large as possible. The upper limit of the width d11 and d12 is limited by the desired device integration.

Figure 29:
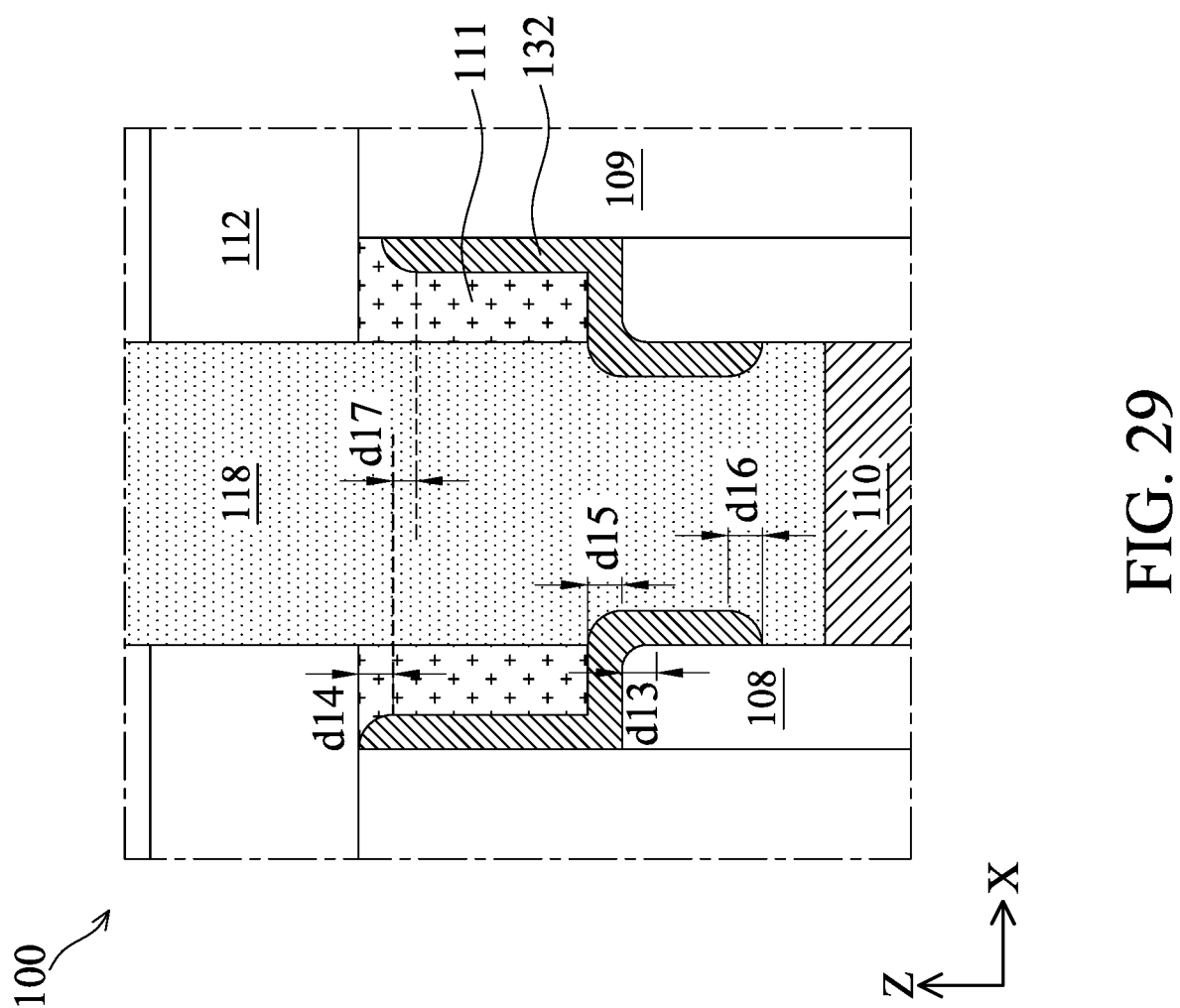

As shown in FIG. 29, the liner layer 132 may have rounded corners in some embodiments. For example, the bottom surface of the liner layer 132 may be rounded due to the deposition on the inhibitor layer 129 and/or various etching processes performed to the liner layer 132. Also, the bottom surface of the liner layer 132 may be rounded due to various etching processes performed thereto, and the elbow of the liner layer 132 right above the top corner of the gate spacers 108 may be rounded due to deposition of the liner layer 132 and/or various etching processes performed to the liner layer 132. The dimensions d13, d14, d15, and d16 indicate the vertical distance of the curve at the inner surface of the elbow, the top surface, the outer surface of the elbow, and the bottom surface of the liner layer 132, respectively. In some embodiments, each of the dimensions d13, d14, d15, and d16 may be, for example, in the range of about 0.5 nm to about 15 nm. Having rounded corner in the liner layer 132 assists in the deposition of the SAC layer 111 and the vias 118 in some instances. Further, within the same trench 204, the portion of the liner layer 132 on the left side of the via 118 and the portion of the liner layer 132 on the right side of the via 118 may have different heights in some embodiments, caused by various etching process performed thereto. In those embodiments, the top surfaces of the two portions are offset from each by a distance d17, which may be, for example, in a range of about 0.5 nm to about 15 nm.

Figure 30:
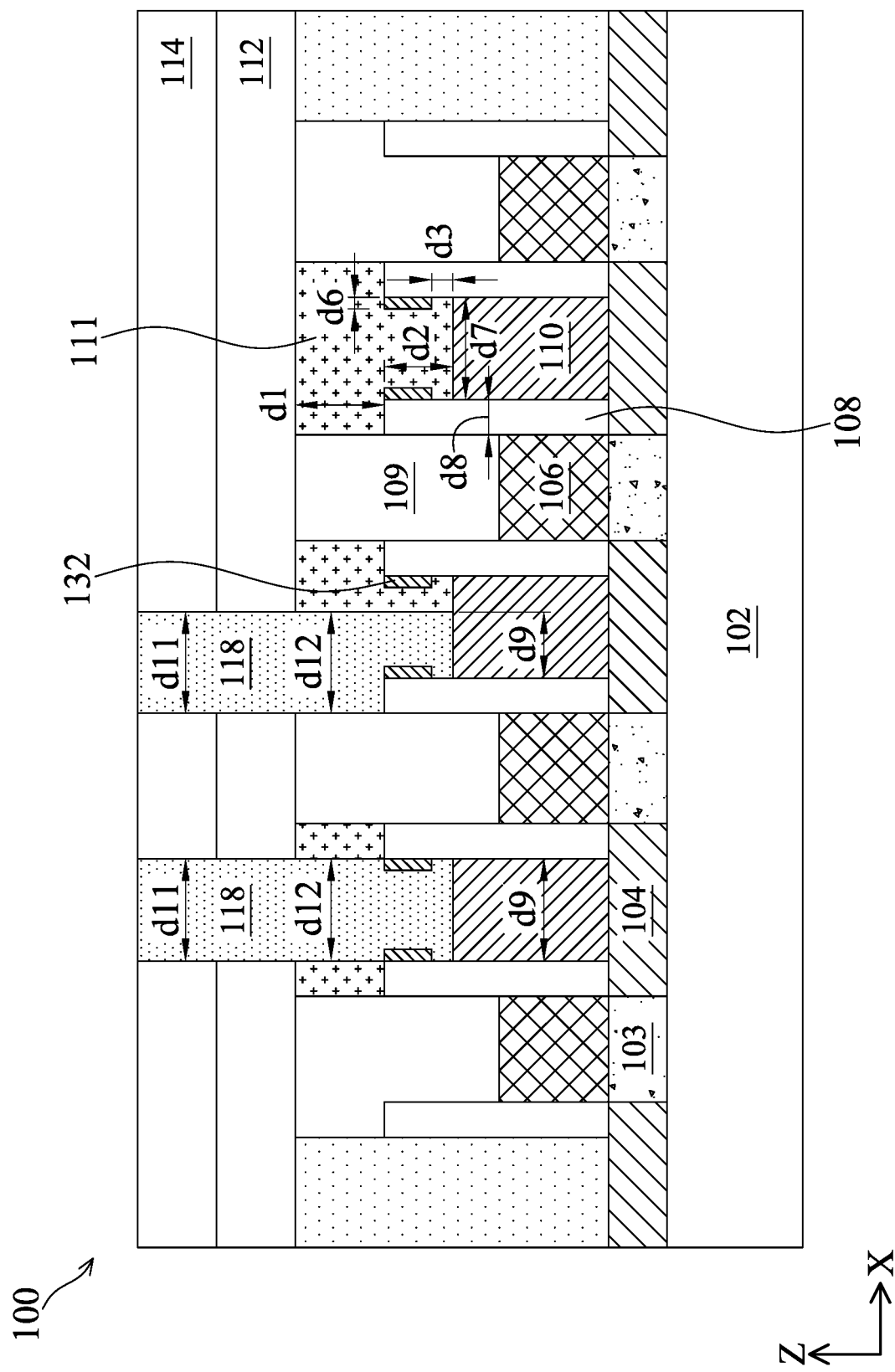
Figure 31:
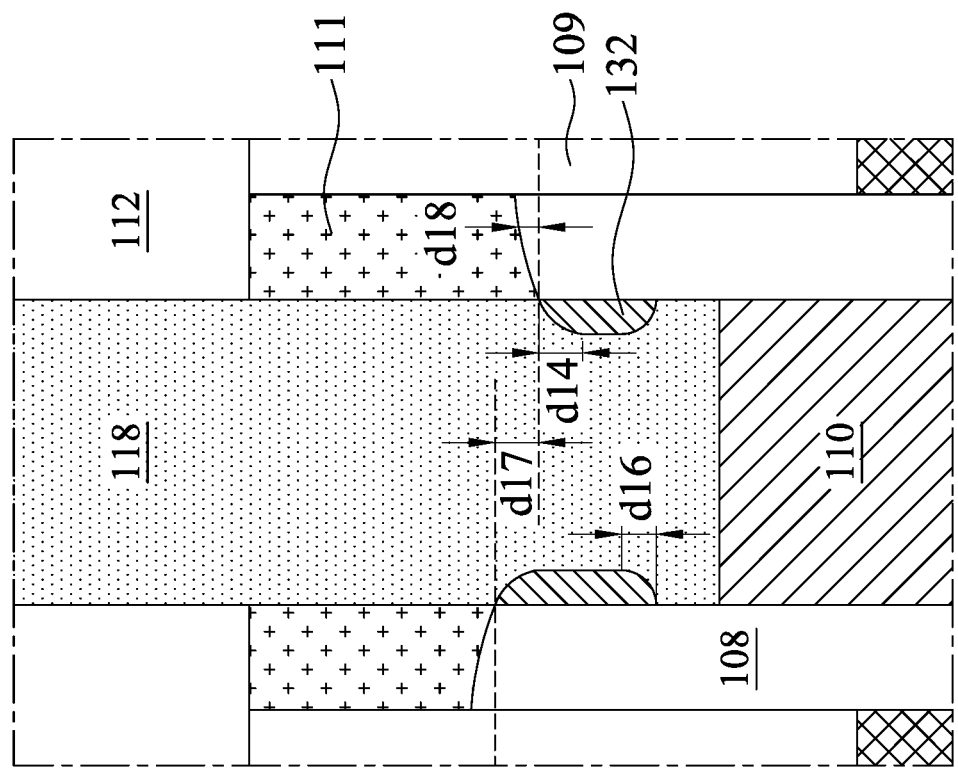

FIG. 30 illustrates various dimensions of some features of the device 100, according to some embodiments where the portion of the liner layer 132 disposed above the gate spacers 108 is removed (for example, the device 100 is processed by the operation 25a through 25d). The dimensions d3, d6, d7, d8, d9, d11, and d12 are the same as those discussed above with reference to FIG. 28. In an embodiment, the dumbbell shaped SAC layer 111 has an upper section that is above the top surface of the gate spacers 108, and the upper section of the SAC layer 111 has a thickness d1. The SAC layer 111 further includes a lower section that is below the upper section. The lower section of the SAC layer 111 has a thickness d2. The dimension d1 may be about 0.5 nm to about 30 nm in some embodiments for the same reason as discussed above for the dimension d1 in FIG. 28. The dimension d2 may be about 0.5 nm to about 30 nm in some embodiments for the same reason as discussed above for the dimension d2 in FIG. 28. As shown in FIG. 31, the top and bottom surface of the liner layer 132 may have rounded corners in some embodiments. The dimensions d14 and d16 indicate the vertical distance of the curve at the top surface and the bottom surface of the liner layer 132, respectively. In some embodiments, each of the dimensions d14 and d16 may be, for example, in the range of about 0.5 nm to about 15 nm. Also, in some embodiments, the top surfaces of the two portions of the liner layer 132 on the left and right side of the via 118 are offset from each by a distance d17, which may be, for example, in a range of about 0.5 nm to about 15 nm. Further in this embodiment, the top surface of the gate spacers 108 may have rounded corners due to various etching process performed thereto. The dimension d18 indicates the vertical distance of the curve at the top surface of the gate spacers 108. In some embodiments, the dimensions d18 may be in the range of about 0.5 nm to about 15 nm. Such range may allow the SAC layer 111 to more easily fill in the trenches 204 during the operation 26 (see FIGS. 1A, 1C, 11, 12, 21, and 22) while maintaining the gate spacers 108 sufficiently high for various purposes such as isolation of the gate stacks 106 from the nearby conductive features. If the dimensions d18 are too small (such as less than 0.5 nm), it may be difficult to the SAC layer 111 to fill in the trenches 204 due to the sharp corners of the gate spacers 108 in some instances. If the dimensions d18 are too large (such as more than 15 nm), the gate spacers 108 may be too thin or too short to protect the gate stacks 106 in some instances.

FIGS. 32, 33, and 34 illustrate the structure of the device 100, in portion, in some alternative embodiments. Referring to FIG. 32, the liner layer 132 is not formed in the area laterally between the two gate spacers 108. In other words, the liner layer 132 is fully above the gate spacers 108. This may be formed by depositing the inhibitor layer 129 (operation 20) sufficiently thick so that the sidewalls of the gate spacers 108 are covered by the inhibitor layer 129. In such cases, the liner layer 132 is deposited fully above the gate spacers 108. In some embodiments, having no liner layer 132 between the gate spacers 108 might advantageously increase the volume of the vias 118. Referring to FIG. 33, the SAC layer 111 and the liner layer 132 are not directly above the gate spacers 108. This may result from a high etch selectivity between the S/D contact 110 and the SAC layer 109 during the recess of the S/D contact 110 (operation 18). Referring to FIG. 34, the SAC layer 111 may be fully removed during the operation 30 to etch the via holes 206 and then the via 118 is deposited to fill the via hole 206. Such embodiments increase the volume of the vias 118 for reduced S/D contact resistance.

Although not intended to be limiting, embodiments of the present disclosure provide one or more of the following advantages. For example, by utilizing an inhibitor layer, embodiments of the present disclosure form a liner layer on sidewalls of SAC trenches but not on the bottom of the SAC trenches. Thus, a vertical etching of the liner layer is avoided when etching via holes through SAC layers, which generally improves the process's robustness and the TDDB performance of the device. For another example, embodiments of the present disclosure may optionally keep or remove the liner layer inside via holes depending on design objectives, which increases the process's flexibility. Embodiments of the present disclosure can be readily integrated into existing processes.

In one example aspect, the present disclosure is directed to a method that includes providing a substrate, two structures over the substrate, a source/drain (S/D) contact over the substrate and between the two structures, wherein each of the two structures includes a gate stack, two gate spacers on two opposing sidewalls of the gate stack, and a first capping layer over the gate stack and the gate spacers. The method further includes recessing the S/D contact to result in a trench, wherein a top surface of the S/D contact is below a top surface of the gate spacers inside the trench. After the recessing of the S/D contact, the method further includes selectively depositing an inhibitor layer on the S/D contact but not on surfaces of the first capping layer and not on top surfaces of the gate spacers; depositing a liner layer over top and sidewall surfaces of the first capping layer and surfaces of the gate spacers that are exposed in the trench, wherein the liner layer is free from at least a central portion of the inhibitor layer; and removing the inhibitor layer.

In an embodiment, after the removing of the inhibitor layer, the method further includes depositing a second capping layer in the trench, wherein a portion of the second capping layer is disposed vertically between the liner layer and the S/D contact.

In a further embodiment, the method includes etching a via hole through the second capping layer and exposing the S/D contact and forming a conductive via in the via hole. In a further embodiment, before the forming of the conductive via, the method includes removing at least a portion of the liner layer that is exposed in the via hole. In a further embodiment, before the etching of the via hole, the method includes performing a chemical mechanical planarization process to at least the second capping layer; forming a contact etch stop layer (CESL) over the second capping layer; and forming an inter-layer dielectric (ILD) layer over the contact etch stop layer, wherein the via hole penetrates through the ILD layer, the CESL, and the second capping layer.

In another further embodiment, after the removing of the inhibitor layer and before the depositing of the second capping layer in the trench, the method includes depositing a hard mask layer over the liner layer and in the trench; recessing the hard mask layer such that a first portion of the liner layer is exposed in the trench and is above the hard mask layer; removing the first portion of the liner layer; and removing the hard mask layer. In some embodiments, the second capping layer includes at least one of $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, or ZrSi, wherein the second capping layer and the liner layer include different materials.

In some embodiment of the method, the inhibitor layer includes an organic film having amphiphilic molecules. In some embodiment, the liner layer includes at least one of $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, or ZrSi.

In another example aspect, the present disclosure is directed to a method that includes providing a substrate, two structures over the substrate, a source/drain (S/D) contact over the substrate and between the two structures, wherein each of the two structures includes a gate stack, two gate spacers on two opposing sidewalls of the gate stack, and a first capping layer over the gate stack and the gate spacers. The method further includes recessing the S/D contact to result in a trench, wherein the trench exposes a top surface of the S/D contact, top and sidewall surfaces of the gate spacers, and sidewall surfaces of the first capping layer; selectively depositing an inhibitor layer on the top surface of the S/D contact but not on the sidewall surfaces of the first capping layer and the top surfaces of the gate spacers; and depositing a liner layer over at least the sidewall surfaces of the first capping layer and the top surfaces of the gate spacers, wherein the liner layer is free from at least a central portion of the inhibitor layer. The method further includes removing the inhibitor layer and depositing a second capping layer in the trench.

In an embodiment of the method, a portion of the second capping layer is disposed in direct contact with the gate spacers, the liner layer, and the S/D contact. In an embodiment, the method further includes etching a via hole through the second capping layer and exposing the S/D contact. In a further embodiment, the method includes removing a portion of the liner layer that is exposed in the via hole. In another further embodiment, the method includes forming a conductive via in the via hole, wherein a portion of the conductive via extends from a sidewall of one of the gate spacers to a sidewall of the other one of the gate spacers.

In an embodiment, after the removing of the inhibitor layer and before the depositing of the second capping layer in the trench, the method includes depositing a hard mask layer over the liner layer and in the trench; recessing the hard mask layer such that a first portion of the liner layer is exposed in the trench and is above the hard mask layer; removing the first portion of the liner layer; and removing the hard mask layer to expose the S/D contact in the trench.

In yet another example aspect, the present disclosure is directed to a semiconductor structure that includes a substrate and two structures over the substrate. Each of the two structures includes a gate stack, two gate spacers on two opposing sidewalls of the gate stack, and a first capping layer over the gate stack and the gate spacers. The semiconductor structure further includes a source/drain (S/D) feature over the substrate and between the two gate stacks; an S/D contact over the S/D feature and between the two gate spacers; a conductive via disposed over and electrically connected to the S/D contact; and a liner layer disposed between a sidewall of the first capping layer and the conductive via, wherein the liner layer does not touch the S/D contact.

In an embodiment, the semiconductor structure further includes a second capping layer, wherein at least a portion of the second capping layer is disposed between the liner layer and the conductive via. In some further embodiments, a portion of the liner layer is in direct contact with and sandwiched between the first capping layer and the conductive via. In some further embodiments, a portion of the conductive via is in direct with another sidewall of the first capping layer. In some embodiments, the liner layer is also disposed between a sidewall of the gate spacers and the conductive via.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate;
a first structure over the substrate, wherein the first structure includes a first gate stack and two first gate spacers on two opposing sidewalls of the first gate stack;

a second structure over the substrate, wherein the second structure includes a second gate stack and two second gate spacers on two opposing sidewalls of the second gate stack;

a source/drain (S/D) feature over the substrate and adjacent to the first and the second gate stacks;

an S/D contact over the S/D feature and between one of the first gate spacers and one of the second gate spacers;

a conductive via disposed over and electrically connected to the S/D contact;

a dielectric liner layer, wherein a first portion of the dielectric liner layer is disposed on a sidewall of the one of the first gate spacers and is above the S/D contact and spaced a vertical distance from the S/D contact; and a capping layer over and interfacing an upper horizontally disposed surface of at least one of the dielectric liner layer or the one of the first gate spacers.

2. The semiconductor structure of claim 1, wherein a first portion of the capping layer is disposed in the vertical distance between the first portion of the dielectric liner layer and the S/D contact.

3. The semiconductor structure of claim 2, wherein a second portion of the capping layer is disposed laterally between the first portion of the dielectric liner layer and the conductive via.

4. The semiconductor structure of claim 2, wherein a second portion of the dielectric liner layer is disposed above the sidewall of the one of the first gate spacers and is connected to the first portion of the dielectric liner layer.

5. The semiconductor structure of claim 2, wherein a second portion of the dielectric liner layer is disposed on a sidewall of the one of the second gate spacers and is directly above the S/D contact and spaced from the S/D contact.

6. The semiconductor structure of claim 5, wherein a portion of the conductive via is disposed vertically between the second portion of the dielectric liner layer and the S/D contact.

7. The semiconductor structure of claim 1, wherein a second portion of the dielectric liner layer is disposed on a sidewall of the one of the second gate spacers and is directly above the S/D contact and spaced from the S/D contact.

8. The semiconductor structure of claim 7, wherein a portion of the conductive via is disposed vertically between the first portion of the dielectric liner layer and the S/D contact.

9. The semiconductor structure of claim 8, wherein another portion of the conductive via is disposed vertically between the second portion of the dielectric liner layer and the S/D contact.

10. A semiconductor structure, comprising:
a first structure over a substrate, wherein the first structure includes a first gate stack, two first gate spacers on two opposing sidewalls of the first gate stack, and a first capping layer over the first gate stack;

a second structure over the substrate, wherein the second structure includes a second gate stack, two second gate spacers on two opposing sidewalls of the second gate stack, and a second capping layer over the second gate stack;

a source/drain (S/D) feature over the substrate and adjacent to the first and the second gate stacks;

an S/D contact over the S/D feature and between one of the first gate spacers and one of the second gate spacers;

a conductive via disposed over and electrically connected to the S/D contact; and a dielectric liner layer, wherein a first portion of the dielectric liner layer is disposed on a sidewall of the one of the first gate spacers, and a second portion of the dielectric liner layer is disposed on a sidewall of the one of the second gate spacers; and a third capping layer, wherein the first portion of the dielectric liner layer is disposed laterally between the first capping layer and the third capping layer.

11. The semiconductor structure of claim 10, wherein the first portion of the dielectric liner layer is also disposed on a sidewall of the first capping layer.

12. The semiconductor structure of claim 11, wherein the first portion of the dielectric liner layer is also disposed on a top surface of the one of the first gate spacers.

13. The semiconductor structure of claim 10, wherein a portion of the conductive via is disposed vertically between the first portion of the dielectric liner layer and the S/D contact.

14. The semiconductor structure of claim 13, wherein another portion of the conductive via is disposed vertically between the second portion of the dielectric liner layer and the S/D contact.

15. The semiconductor structure of claim 14, wherein the third capping layer is disposed laterally between the first capping layer and the conductive via.

16. The semiconductor structure of claim 13, wherein a portion of the third capping layer is disposed vertically between the second portion of the dielectric liner layer and the S/D contact.

17. A semiconductor structure, comprising:
a first structure over a substrate, wherein the first structure includes a first gate stack and two first gate spacers on two opposing sidewalls of the first gate stack;

a second structure over the substrate, wherein the second structure includes a second gate stack and two second gate spacers on two opposing sidewalls of the second gate stack;

a source/drain (S/D) feature over the substrate and adjacent to the first and the second gate stacks;

an S/D contact over the S/D feature and between one of the first gate spacers and one of the second gate spacers;

a conductive via disposed over and electrically connected to the S/D contact;

a dielectric liner layer, wherein a first portion of the dielectric liner layer is disposed on a sidewall of the one of the first gate spacers and is directly above the S/D contact and spaced from the S/D contact, wherein a portion of the conductive via is disposed vertically between the first portion of the dielectric liner layer and the S/D contact; and a capping layer disposed on an upper surface of the S/D contact.

18. The semiconductor structure of claim 17, wherein the conductive via is disposed vertically between a second portion of the dielectric liner layer and the S/D contact.

19. The semiconductor structure of claim 17, wherein a portion of the capping layer is disposed vertically between a second portion of the dielectric liner layer disposed on one of the second gate spacers and the S/D contact.

20. The semiconductor structure of claim 17, wherein the first portion of the dielectric liner layer is also disposed on a top surface of the one of the first gate spacers.

* * * * *